(12) United States Patent
Schulz

(10) Patent No.: US 7,679,135 B2
(45) Date of Patent: Mar. 16, 2010

(54) FINFET DEVICE WITH GATE ELECTRODE AND SPACERS

(75) Inventor: Thomas Schulz, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/349,062

(22) Filed: Jan. 6, 2009

(65) Prior Publication Data

US 2009/0114979 A1 May 7, 2009

Related U.S. Application Data

(62) Division of application No. 11/060,959, filed on Feb. 18, 2005, now Pat. No. 7,488,650.

(51) Int. Cl.
*H01L 29/772* (2006.01)
(52) U.S. Cl. .............. 257/329; 257/E29.262; 438/268
(58) Field of Classification Search ......... 257/329, 257/E29.262; 438/268
See application file for complete search history.

(56) References Cited

U.S. PATENT DOCUMENTS

| | | | |
|---|---|---|---|
| 6,413,802 B1 * | 7/2002 | Hu et al. ............. | 438/151 |
| 6,475,869 B1 | 11/2002 | Yu | |
| 6,835,609 B1 | 12/2004 | Lee et al. | |
| 6,855,989 B1 | 2/2005 | Wang et al. | |
| 6,967,175 B1 | 11/2005 | Ahmed et al. | |
| 2003/0057486 A1 * | 3/2003 | Gambino et al. .......... | 257/347 |
| 2004/0007738 A1 | 1/2004 | Fried et al. | |
| 2004/0092060 A1 | 5/2004 | Gambino et al. | |
| 2004/0092067 A1 | 5/2004 | Hanafi et al. | |
| 2004/0219722 A1 * | 11/2004 | Pham et al. ............... | 438/157 |
| 2005/0019993 A1 * | 1/2005 | Lee et al. ................ | 438/157 |
| 2005/0020020 A1 * | 1/2005 | Collaert et al. ........... | 438/300 |
| 2005/0059194 A1 | 3/2005 | Lee et al. | |
| 2005/0072992 A1 * | 4/2005 | Lee et al. ................ | 257/288 |
| 2005/0106789 A1 * | 5/2005 | Gottsche et al. .......... | 438/163 |
| 2005/0239242 A1 | 10/2005 | Zhu et al. | |

FOREIGN PATENT DOCUMENTS

WO    WO 03/081675 A1    10/2003

* cited by examiner

*Primary Examiner*—Steven J Fulk
(74) *Attorney, Agent, or Firm*—Slater & Matsil, L.L.P.

(57) ABSTRACT

A semiconductor device includes a source region, a drain region, and a fin that connects the source region to the drain region. A gate electrode having a substantially planar surface overlies the fin and is positioned between the drain region and the source region. A first set of spacers is positioned between a first sidewall of the gate electrode and the source region and between a second sidewall of the gate electrode and the drain region. A second set of spacers is positioned on at least a portion of a top surface of the source region and the drain region and alongside at least a portion of the first set of spacers. At least a portion of sidewalls of the second set of spacers contacts a portion of the first or second sidewall of the gate electrode.

20 Claims, 24 Drawing Sheets

FINFET DEVICE WITH GATE ELECTRODE AND SPACERS

This is a divisional application of U.S. patent application Ser. No. 11/060,959, which was filed on Feb. 18, 2005 now U.S. Pat. No. 7,488,650 and is incorporated herein by reference.

TECHNICAL FIELD

The present invention relates generally to semiconductor devices and, more particularly, to fin field-effect transistors (FinFETs) and methods of manufacture.

BACKGROUND

Size reduction of field-effect transistors (FETs), including reduction of the gate length and gate oxide thickness, has enabled the continued improvement in speed, performance, density, and cost per unit function of integrated circuits over the past few decades. In recent years, advances in technology have yielded a transistor design that utilizes raised source/drain regions having one or more raised channel regions (referred to as fins) interconnecting the source and drain regions. A gate is formed by depositing a conductive layer over and/or adjacent to the fins. This type of transistor is commonly referred to as a FinFET. It has been found that FinFET designs provide better scalability as design requirements shrink and better short-channel control.

FIG. 1 illustrates a perspective view of a dual-fin FinFET 100 of the prior art. The FinFET 100 includes a source 110 and a drain 112 interconnected by fins 114. A gate electrode 116 comprises a contact area and a line that extends over the fins 114. In this embodiment, current flows from the source 110 to the drain 112 when a voltage is applied to a gate electrode 116. Problems, however, may occur during fabrication that may adversely affect the performance of the FinFET.

FIGS. 2a-2f, which are cross-section views taken along the A-A line of FIG. 1, illustrate one such problem that results from the topography of the fin and the source/drain regions. Referring first to FIG. 2a, a gate electrode 116 is deposited over the etched fins 114. As illustrated in FIG. 2a, the topography of the underlying fins 114 and source/drain regions (not shown) is transferred on to the gate electrode 116. This may result in severe drop-off in the surface of the gate electrode film over the fins 114 and source/drain regions.

In FIG. 2b, an anti-reflective coating (ARC) (or other masking material) 210, which acts as a hard mask, is spin coated onto the surface. FIG. 2c illustrates the situation after a photo-resist has been applied and patterned, and an etching step has been performed to remove unwanted portions of the ARC 210. The etching step typically uses an end-point signal to indicate when the gate electrode 116 has been exposed. Often, however, residual ARC remains after the ARC open step in areas in which the ARC is thicker, such as regions 220 of FIG. 2c. This results in incomplete hard mask open in areas with severe topography.

FIG. 2d illustrates the FinFET after an over-etch process has been performed to attempt removal of the remaining ARC 210. As illustrated in FIG. 2d, however, some of the ARC 210 remains after the over-etch process. Performing the over-etch process for a longer duration is not typically preferred due to damage that may occur to the underlying gate electrode 116.

FIG. 2e illustrates the resulting structure after an etch is performed to remove the excess gate electrode material. As illustrated, the excess ARC 210 causes residual gate electrode material, e.g., parasitic spacers 222, running along the outer periphery of the active area. These parasitic spacers 222 may adversely affect the performance of the FinFET.

FIG. 2f is a plan view of the dual-fin FinFET 100 illustrated in FIG. 1 after performing the process described above. Note that the parasitic spacers 222 are formed around the source/drain regions and the fins 114. These parasitic spacers (or residual poly stringers) 222 can adversely affect the performance of the FinFET, and in some cases, the parasitic spacers 222 can cause electrical shorts between the gate and the source/drain regions, rendering the FinFET inoperable.

This problem may be prevented or reduced when using 248 nm lithography processes because of the large resist budget. This allows an excessive over etch during the ARC open process, thus ensuring that all excess ARC is cleared in all areas. However, some processes require a smaller resist budget mask in the gate electrode definition. For example, processes for fabricating FinFET devices having sub 50 nm gates utilize 193 nm lithography technology have very small resist budget mask in the gate electrode definition. In these cases, an over-etch process may not be practical.

One attempt to solve this problem is a thick-layer approach, which involves forming a thick gate electrode, which is typically thicker than the height of the fins. An etch-back process is performed to reduce the thickness of the gate electrode, resulting in a layer that is more planarized than the surface of the beginning gate electrode. As a result of the more planarized surface, an ARC layer may be deposited and patterned such that the excess ARC layer is completely removed, preventing the parasitic spacers described above.

One disadvantage of the thick-layer approach is that the very thick poly-layer itself causes a higher degree of film thickness non-uniformity in the deposited film. This initial non-uniformity can further be worsened by the plasma etch-back process that would typically be a fixed-time etch process where no endpoint signal is employed.

Therefore, there is a need for a method to form a FinFET without having a parasitic spacer formed around the fins and the source/drain regions.

SUMMARY OF THE INVENTION

These and other problems are generally reduced, solved or circumvented, and technical advantages are generally achieved, by embodiments of the present invention, which provides a FinFET without a parasitic spacer.

In an embodiment of the present invention, a method of forming a FinFET is provided. The method comprises forming a mask layer over a substrate; forming a trench in the mask layer thereby exposing at least a portion of the semiconductor layer; patterning one or more fins in exposed regions of the semiconductor layer; forming first insulating spacers along sidewalls of the trench; forming a conductive layer within the trench over the fins; removing remaining portions of the mask layer, thereby exposing a source region and a drain region; and doping the source region and the drain region.

In another embodiment of the present invention, a semiconductor device is provided. The semiconductor device comprises a source region, a drain region, and one or more fins formed on a substrate, wherein the fins connect the source region to the drain region. A gate electrode, having a substantially planar surface overlies the fins, is positioned between the drain region and the source region. A first set of spacers is positioned between the gate electrode and the source region and between the gate electrode and the drain region, and a second set of spacers positioned on at least a portion of the source region and the drain region alongside at least a portion of the first set of spacers.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described in the context of a dual-fin FinFET. Embodiments of the present invention, however, may be used in a variety of contexts. For example, embodiments of the present invention may be used to fabricate FinFETs having fewer or more fins or any other type of device in which the topography is such that it is difficult to completely remove unwanted mask material. Furthermore, embodiments of the present invention have been found to be particularly useful when using 193 nm and below lithography techniques.

It should be noted that embodiments of the present invention provide an efficient method of fabricating a FinFET using a self-aligned gate electrode and self-aligned source/drain regions. The use of self-aligned fabrication techniques allows semiconductor devices including a FinFET to be easily incorporated into known fabrication processes.

Figure 1:
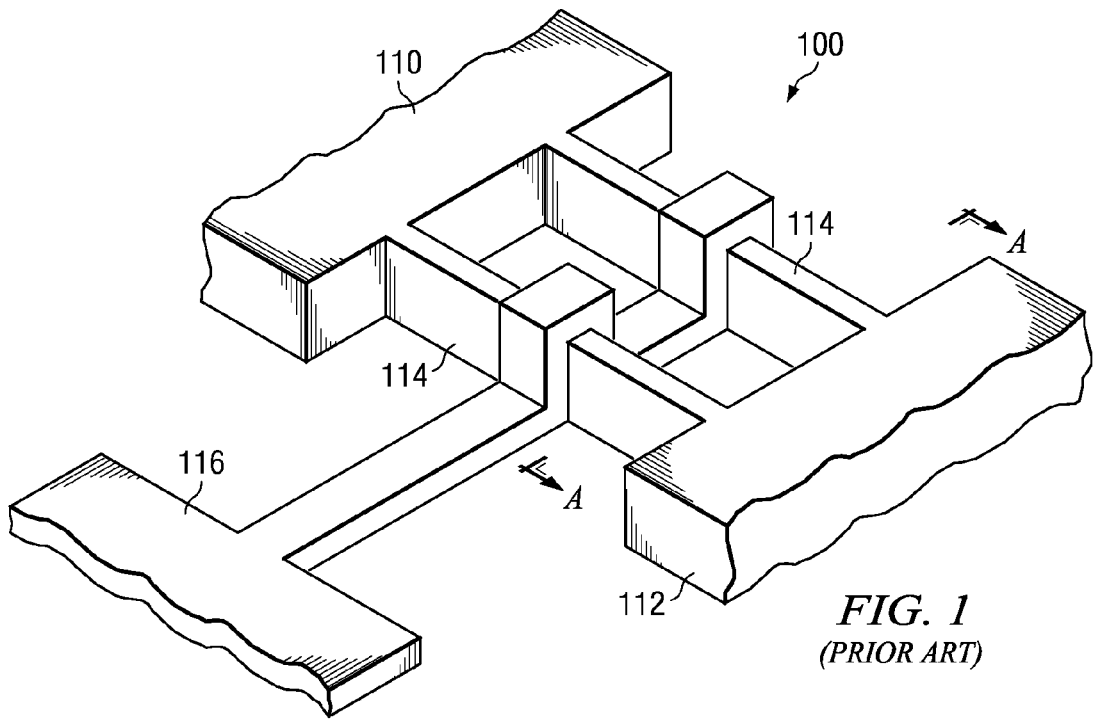
FIG. 1 is a perspective view of a desired dual-fin FinFET of the prior art.
Figure 2A:
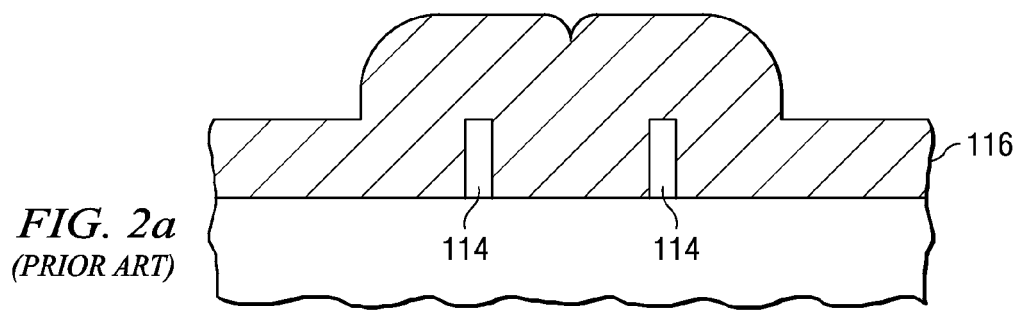
FIGS. 2a-2f illustrate the formation of parasitic spacers around the fins and source/drain regions of a FinFET.
Figure 2B:
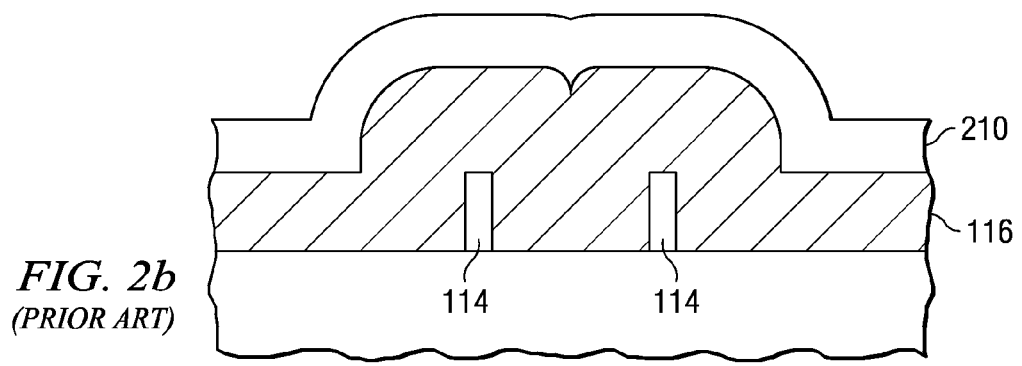
Figure 2C:
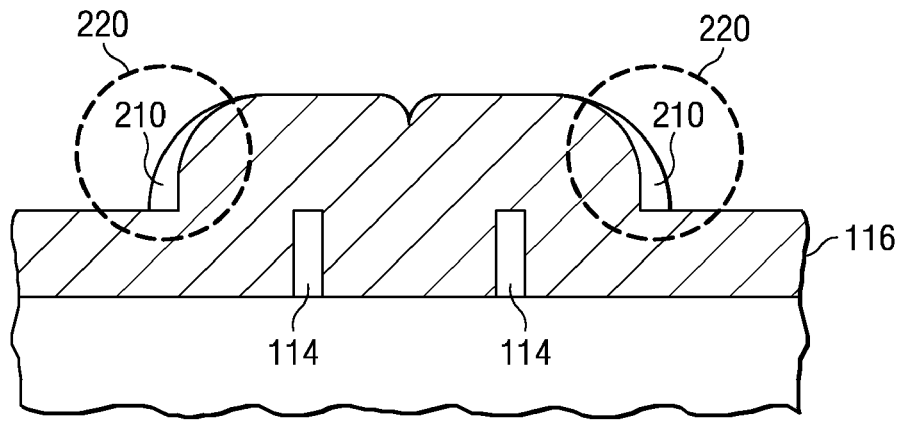
Figure 2D:
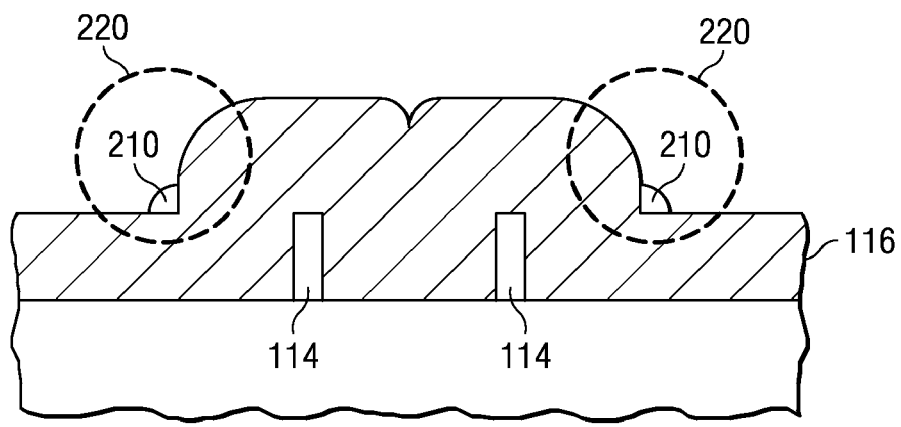
Figure 2E:
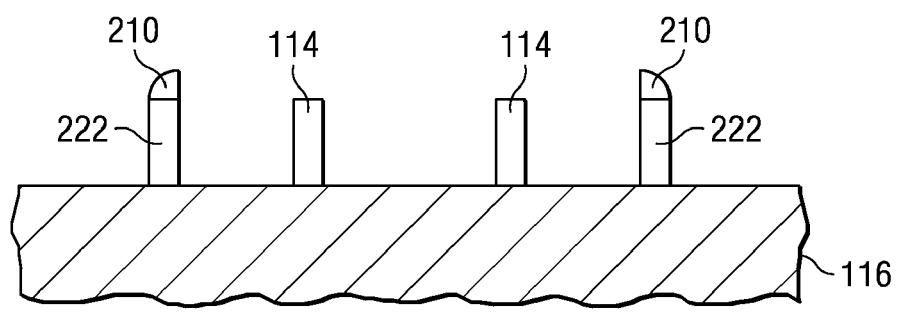
Figure 2F:
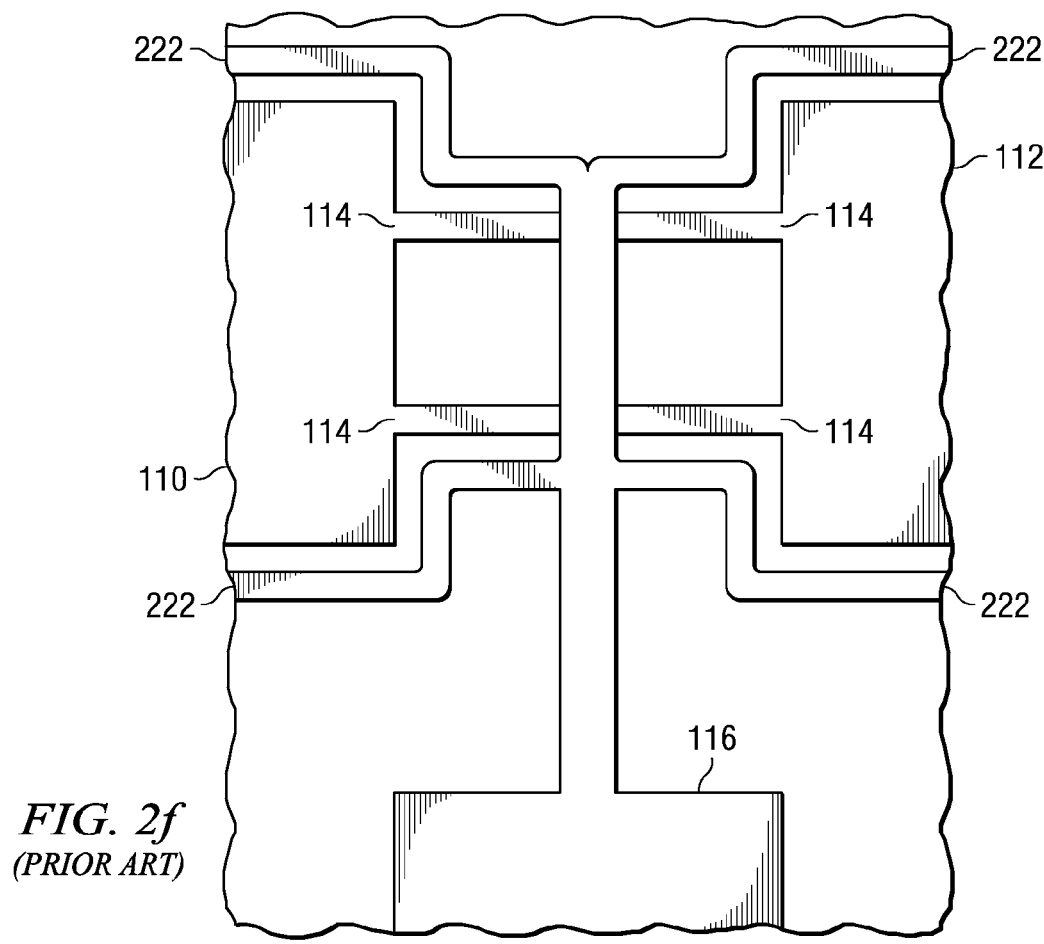
Figure 3A:
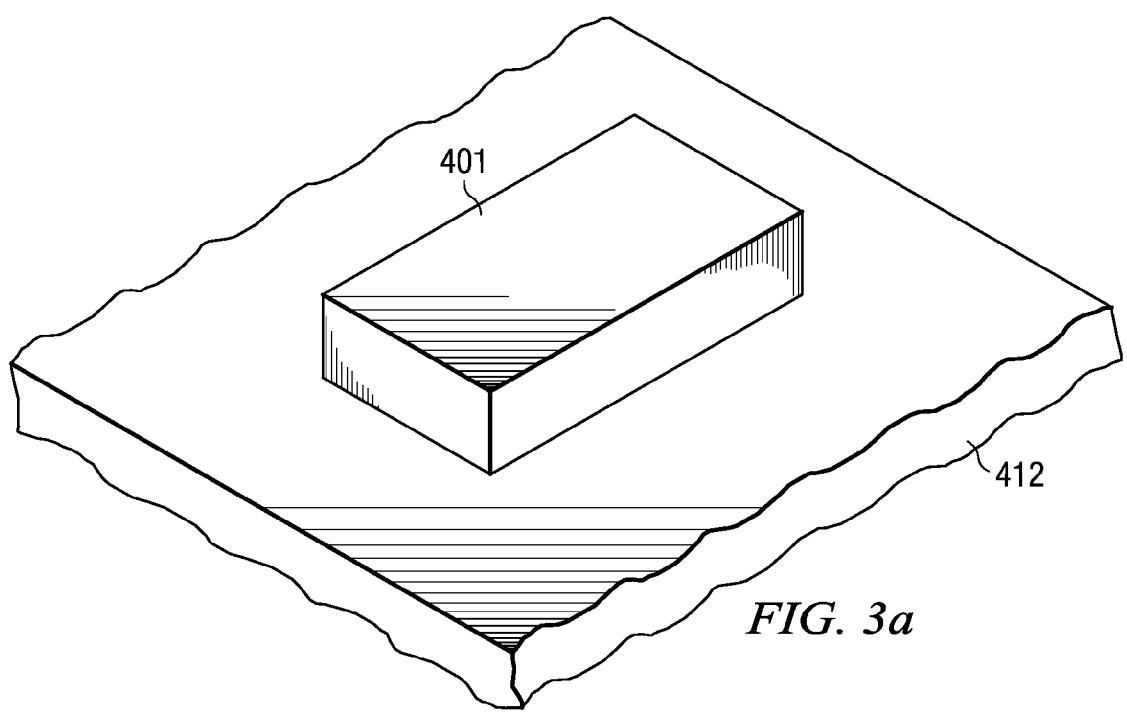
FIG. 3a is a perspective view of an isolation region formed on a substrate in accordance with an embodiment of the present invention.

Referring first to FIG. 3a, a portion of a wafer comprising a substrate 412 having an isolation region 401 formed thereon in accordance with an embodiment of the present invention is shown. In an embodiment, the isolation region 401 and the substrate 412 comprise the semiconductor layer and the buried oxide (BOX) layer, respectively, of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is typically provided on a layer of silicon or glass (not shown).

The isolation region 401, which is commonly referred to as a mesa isolation, may be formed by photolithography techniques known in the art. Generally, a photoresist material may be deposited and exposed in accordance with a desired pattern. In this case, the pattern may correspond to the isolation region 401. Thereafter, an etching step may be performed to remove the unwanted portions of the semiconductor layer, thereby forming the isolation region 401. An additional masking layer may be used to further protect the isolation region 401 during the etching process.

Other substrates, such as multi-layered structures, gradient layers, silicon germanium, one or more semiconductor layers over a silicon germanium layer, or the like, may also be used. As other examples, the substrate 412 may comprise an insulator layer upon which a conductive layer such as polysilicon is deposited, or a bulk wafer with well implants formed thereon. In these other embodiments, the isolation region 401 may be formed by forming a shallow or deep trench isolation structures around the region as is known in the art.

The substrate 412 (e.g., the insulating layer) is preferably about 50 nm to about 400 nm in thickness, but more preferably about 200 nm in thickness. The semiconductor layer 410 is preferably about 10 nm to about 200 nm in thickness, but more preferably about 60 nm in thickness. Other thicknesses and materials may be used. The thickness of the semiconductor layer 410 should correspond to a desired fin height, which may vary from application to application.

In an embodiment in which an SOI wafer is used, the insulator layer may be formed on a silicon carrier layer (not shown). If the substrate is doped and/or used as a back electrode, it is preferred that the silicon carrier layer have a thickness between about 0.3 nm and about 0.4 nm.

Figure 3B:
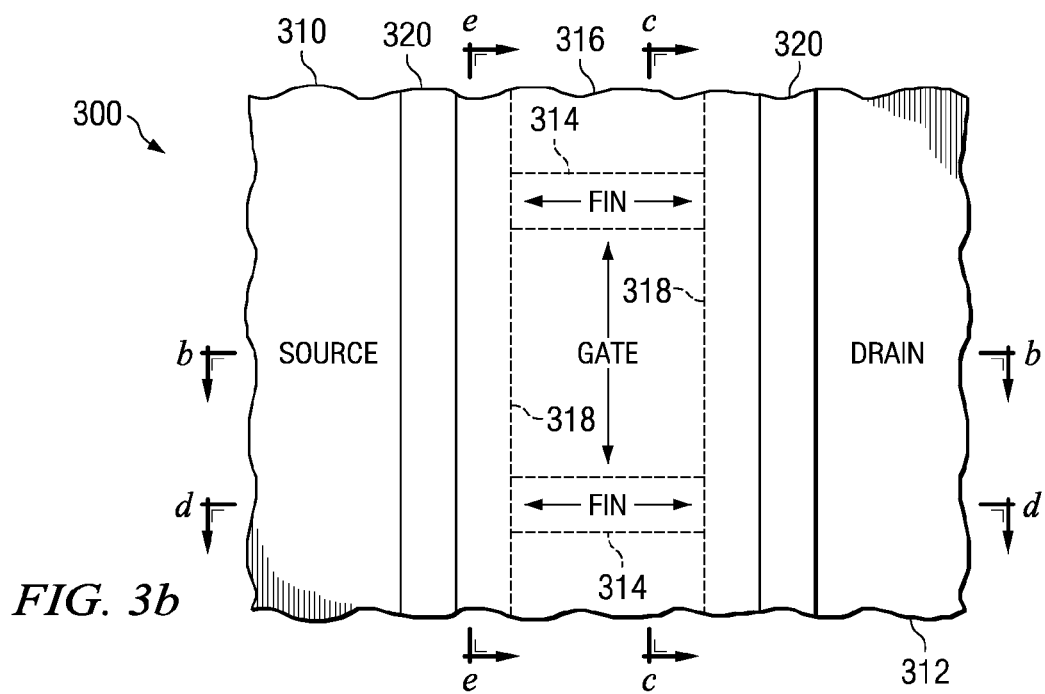
FIG. 3b is a plan view of a FinFET design in accordance with an embodiment of the present invention.
Figure 4A:
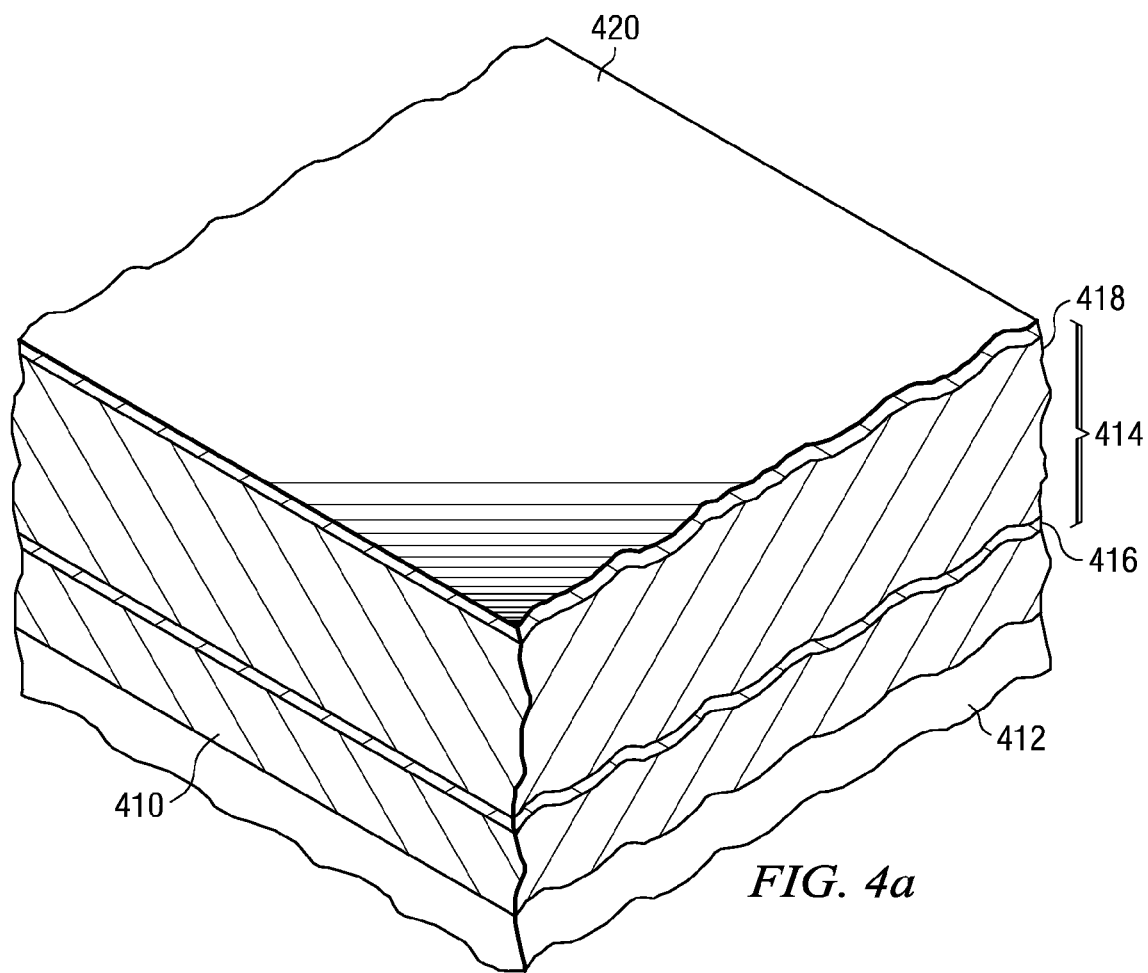
FIGS. 4a-4e to 14a-14e are perspective views and cross-section views that illustrate various process steps of fabricating a FinFET in accordance with an embodiment of the present invention.
Figure 4B:
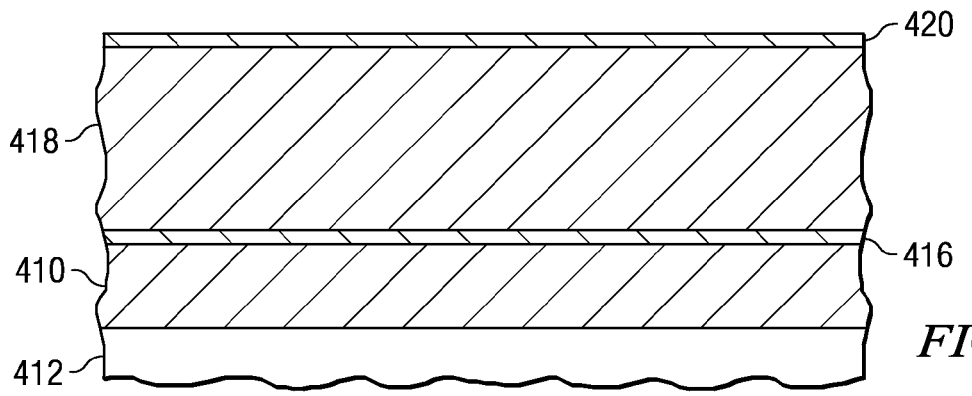
Figure 4C:
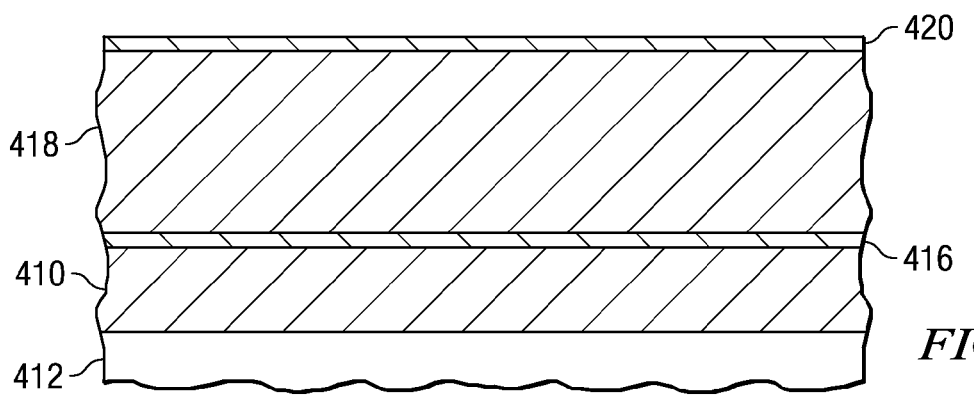
Figure 4D:
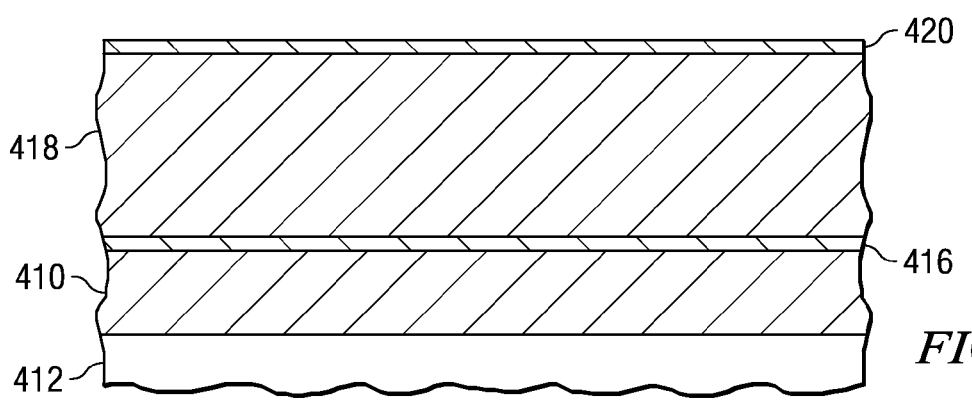
Figure 4E:
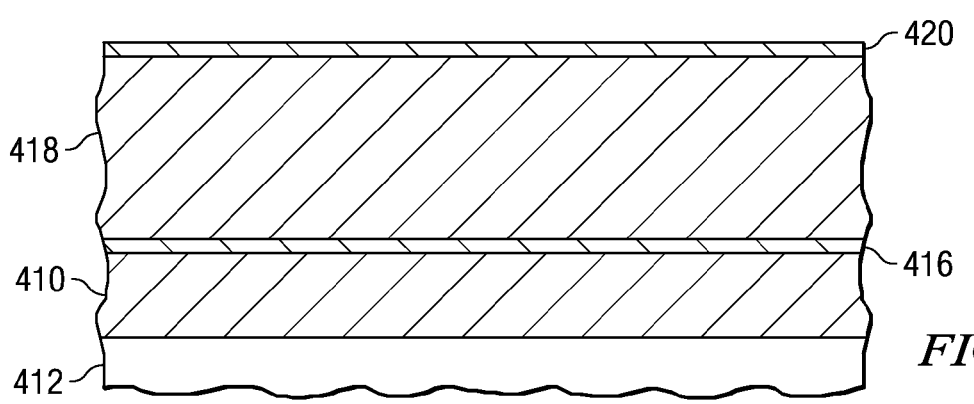
Figure 5A:
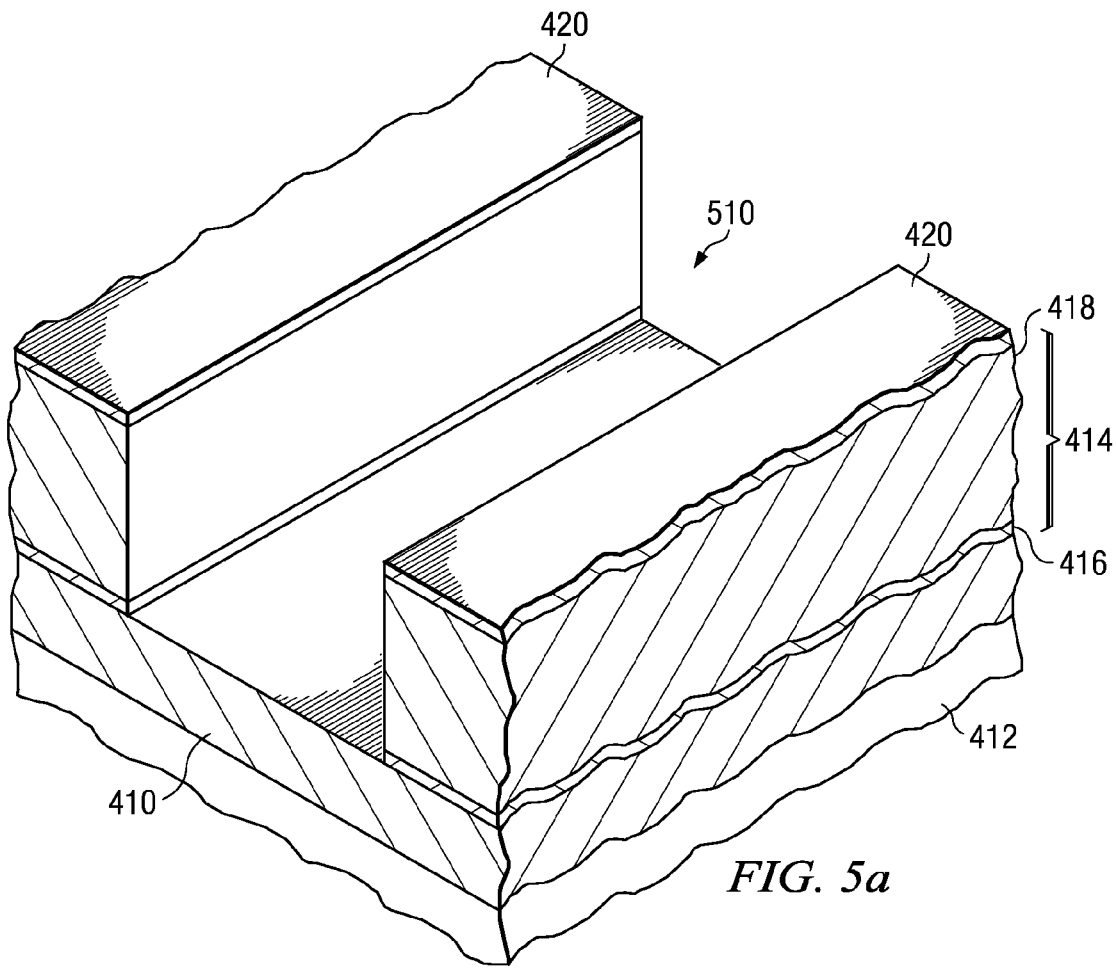
Figure 5B:
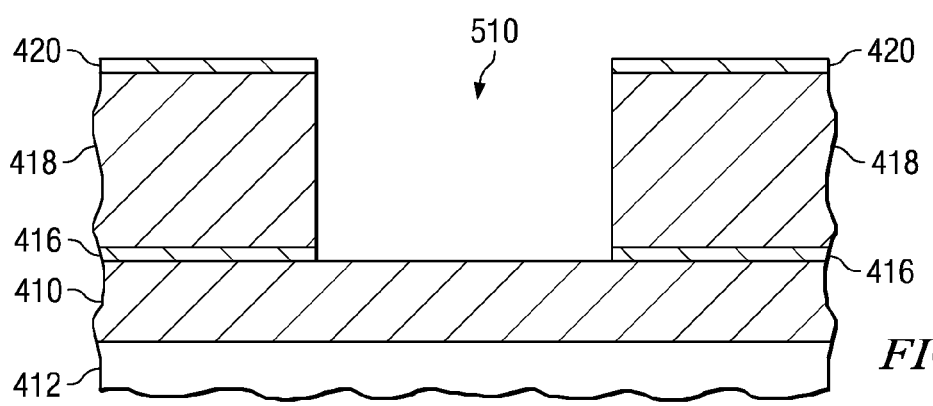
Figure 5C:
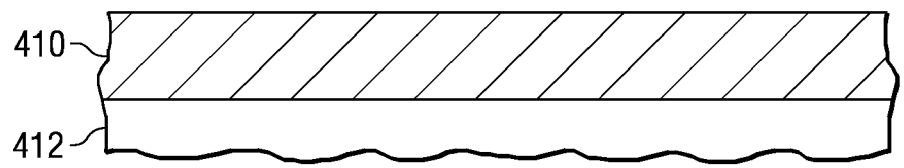
Figure 5D:
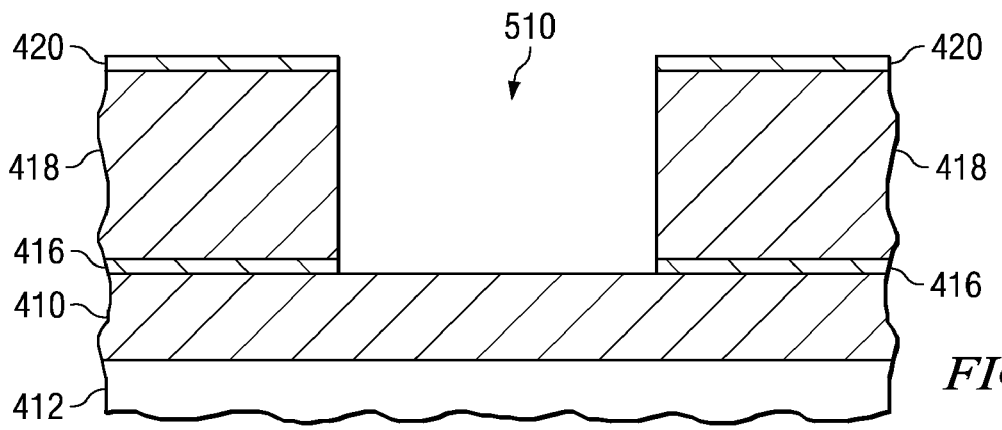
Figure 5E:
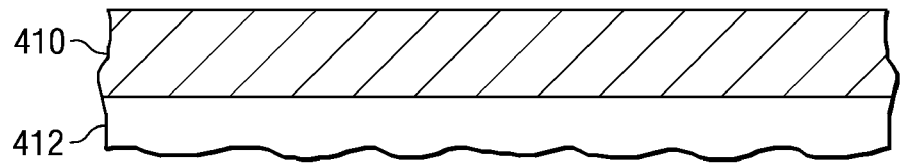
Figure 6A:
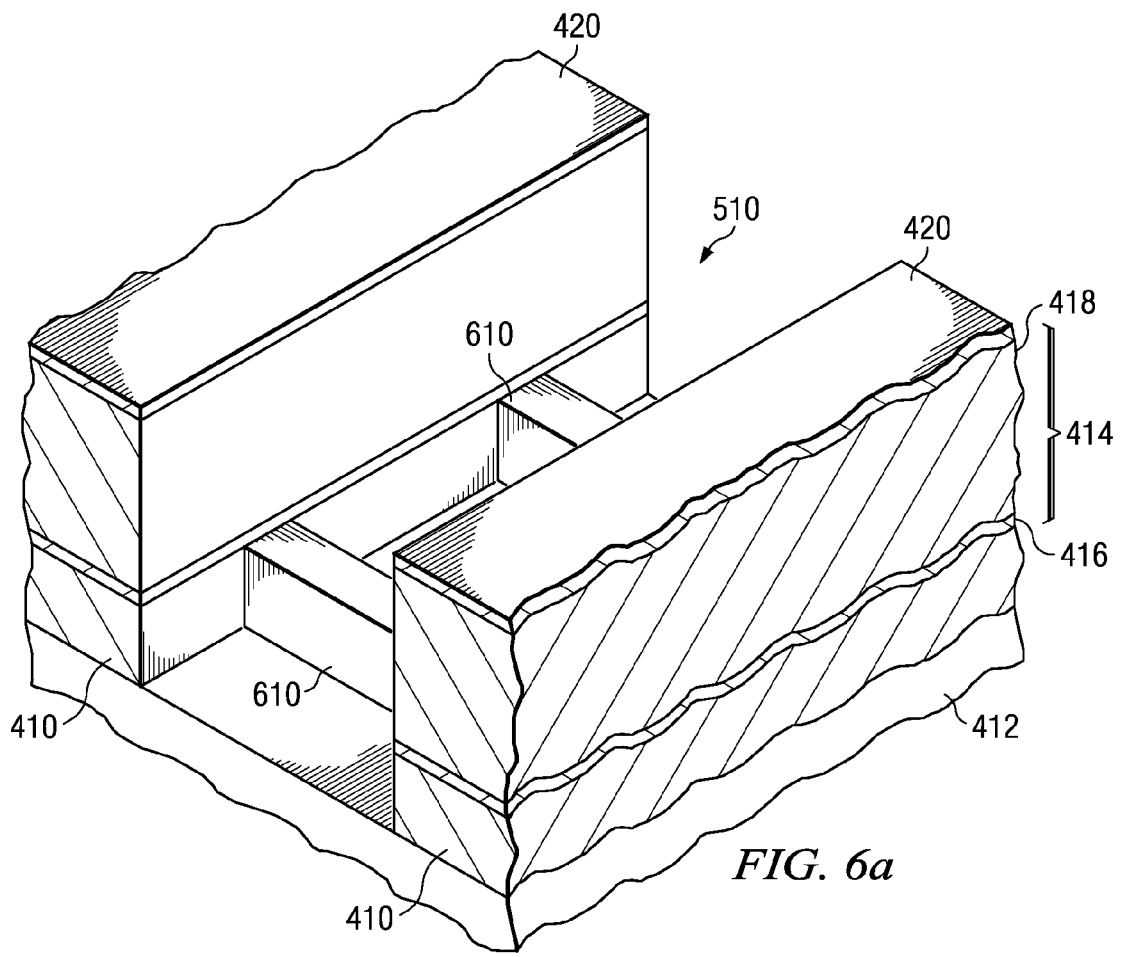
Figure 6B:
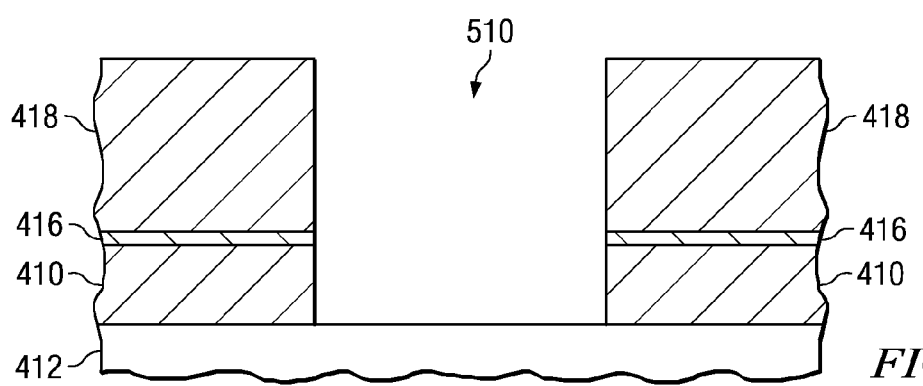
Figure 6C:
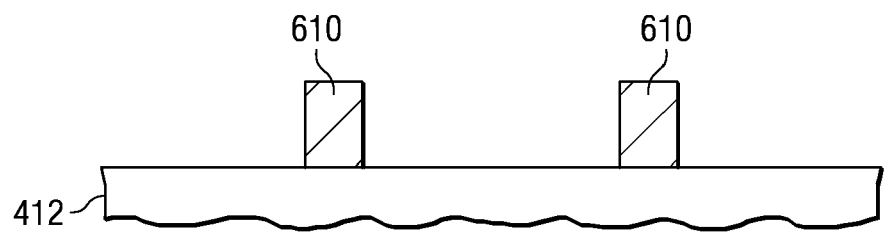
Figure 6D:
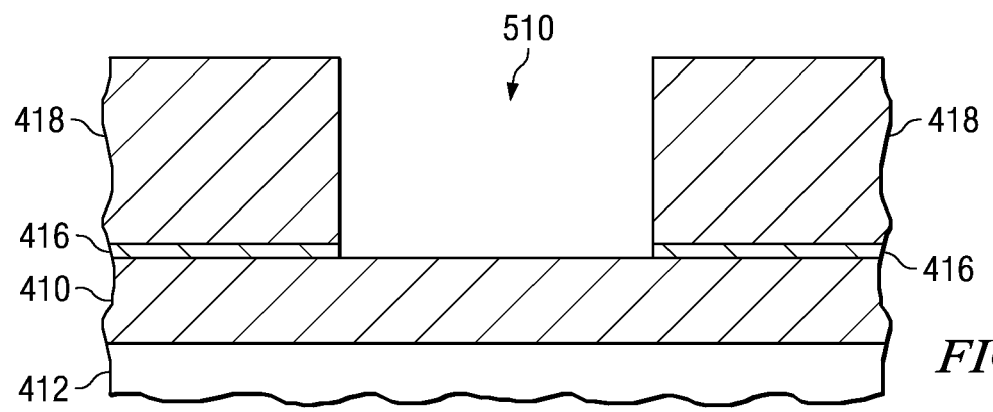
Figure 6E:
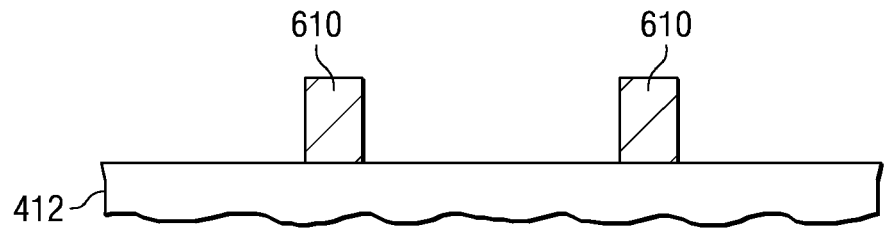
Figure 7A:
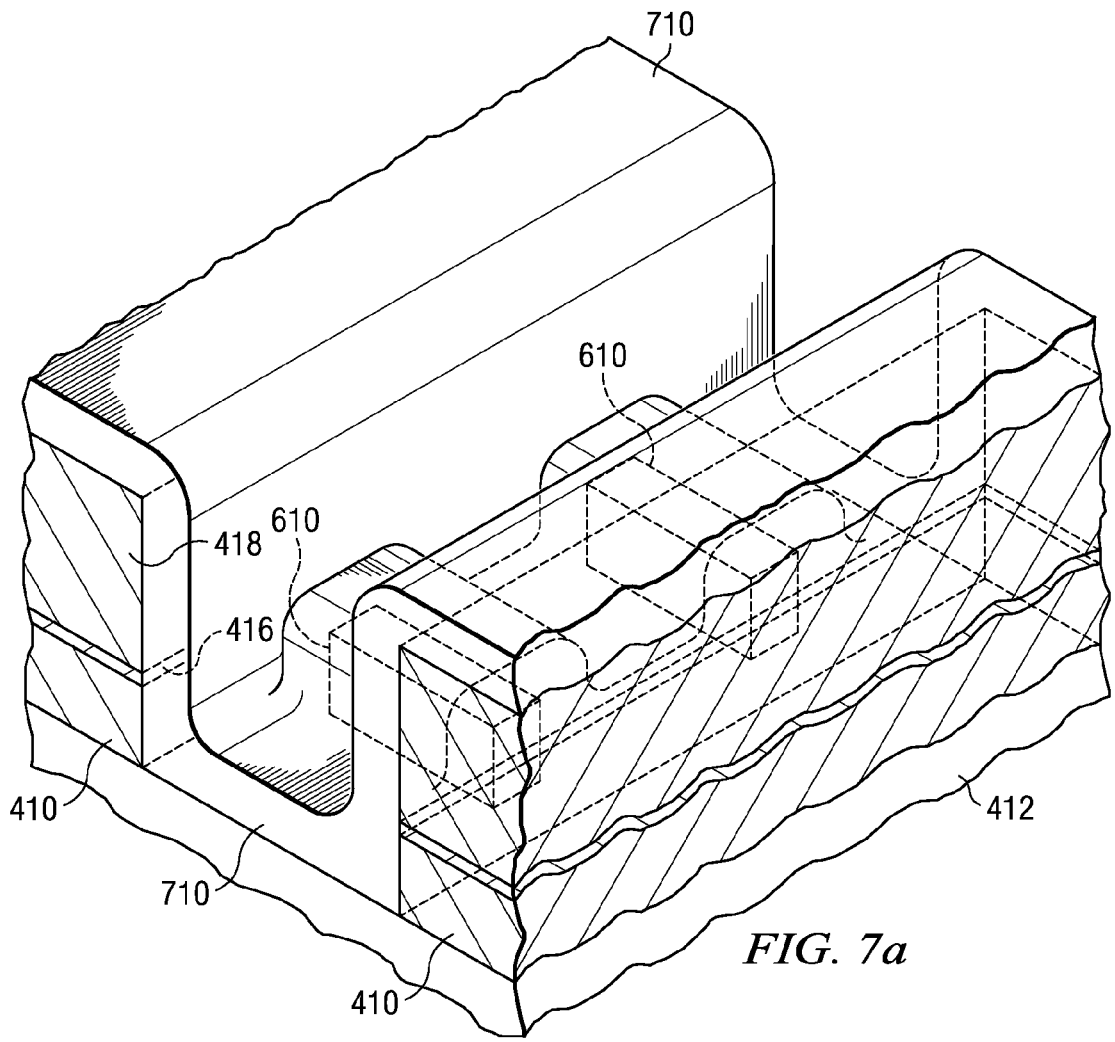
Figure 7B:
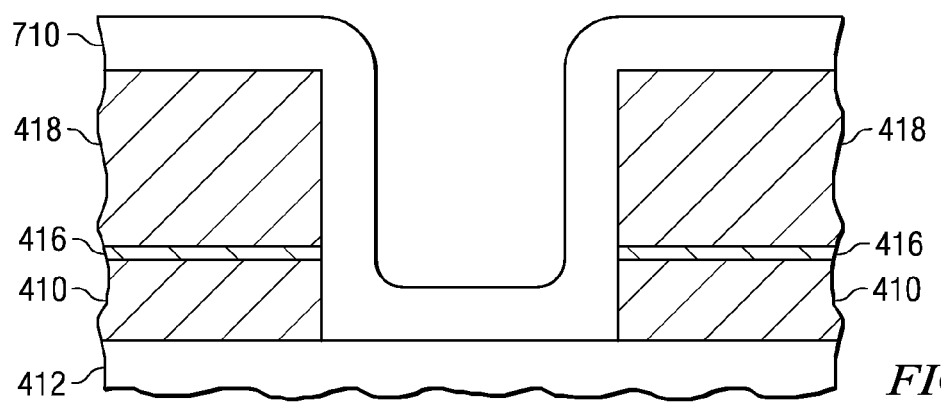
Figure 7C:
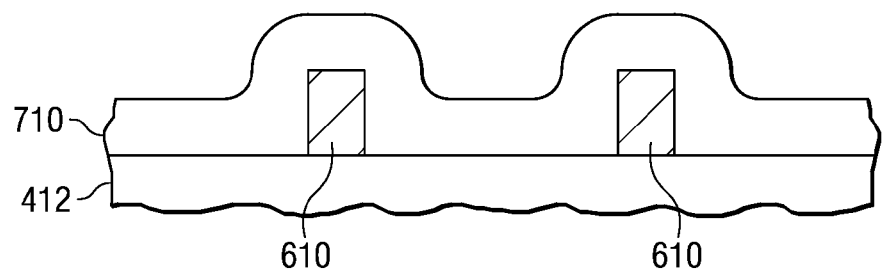
Figure 7D:
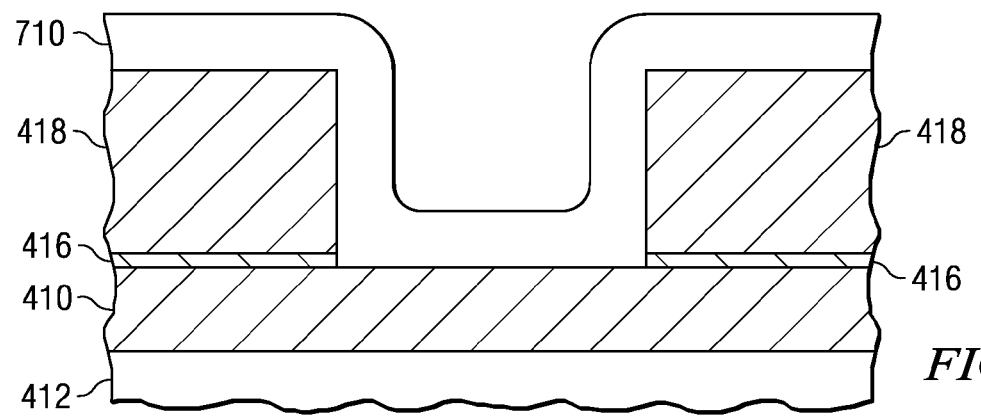
Figure 7E:
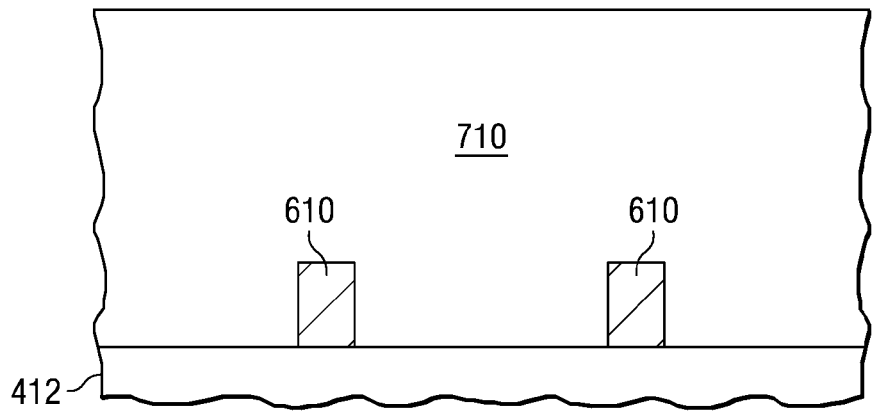

FIG. 3b is a plan view of a dual-fin FinFET 300 fabricated in accordance with an embodiment of the present invention and is provided to better illustrate the process discussed below with reference to FIGS. 4a-e to 14a-e. The dual-fin FinFET may be formed in the isolation region 401 of FIG. 3a. In each set of figures, e.g., FIGS. 4a-4e, the figures having an "A" label are perspective views of the device at that particular stage in processing, and the figures having a "B," "C," "D," and "E" correspond to cross-section views along the B-B, C-C, D-D, and E-E cut lines, respectively, as indicated in FIG. 3b.

Referring briefly back to FIG. 3b, the FinFET 300 has a source 310 and a drain 312 interconnected by fins 314. A gate electrode 316 overlies the fins 314 and is insulated from the source 310 and the drain 312 by spacers 318. An implant spacer 320 may be used to create lightly-doped drains (LDDs) and heavily-doped drains (HDDs) in the source 310 and the drain 312. As mentioned above, a process of forming the FinFET 300 will be discussed below with reference to FIGS. 4a-4e to 14a-14e.

Referring now to FIGS. 4a-4e, a mask layer 414 is formed over the semiconductor layer 410, wherein the semiconductor layer 410 is a portion of the isolation region 401 of FIG. 3a. In subsequent processing steps, the mask layer 414 will be patterned and etching steps will be performed to pattern the underlying semiconductor layer 410 to form the source, drain, and fin regions and may comprise any suitable masking material. In an embodiment, the mask layer 414 comprises an oxide-nitride-oxide (ONO) layer comprising a first oxide layer 416, a nitride layer 418, and a second oxide layer 420. The first and second oxide layers 416, 420 may be formed by any oxidation process, such as wet or dry thermal oxidation in an ambient comprising an oxide, $H_2O$, NO, or a combination thereof. In a preferred embodiment, however, the first and second oxide layers 416, 420 are formed by chemical vapor deposition (CVD) techniques using tetra-ethyl-ortho-silicate (TEOS) and oxygen as a precursor at a temperature ranging from about 600° C. to about 900° C. The first oxide layer 416 and the second oxide layer 420 are preferably about 5 nm and 20 nm, respectively.

The nitride layer 418 may be a silicon nitride layer formed, for example, by CVD techniques using silane and ammonia as precursor gases and deposition temperatures ranging from 600° to 900° Celsius (C.). The nitride layer 418 is preferably about 60 nm to about 200 nm in thickness, but more preferably about 120 nm in thickness, but should have a thickness greater than a desired fin height. Other materials and processes may be used to form the mask layer 414.

Referring now to FIGS. 5a-5e, a trench 510 is formed in the mask layer 414, thereby exposing the underlying semiconductor layer 410. The trench 510 defines the area in which the fins (e.g., fins 314 of FIG. 3) and the gate (e.g., gate electrode 316 of FIG. 3) will be formed. The trench 510 may be formed by photolithography techniques known in the art.

Generally, photolithography involves depositing a photoresist material, which is then masked and exposed in accordance with a desired pattern, such as the trench 510. After exposing the photoresist material, a developing procedure is performed to remove unwanted portions of the photoresist material and to expose the underlying material, i.e., the mask layer 414. After the photoresist mask is patterned, an etching process may be performed to remove unwanted portions of the mask layer 414. The mask layer 414 may be etched using, for example, a reactive ion etching (RIE) process or other, preferably, anisotropic etch process.

FIGS. 6a-6e illustrate formation of fins 610 from the semiconductor layer 410. The fins 610 may be formed, for example, by depositing a photoresist material (not shown) over the surface of the wafer and using photolithography techniques to pattern the photoresist material such that the photoresist material overlying the fins 610 remains.

In an embodiment in which the semiconductor layer 410 is formed of silicon, the fins 610 may be formed, for example, by dry etch (RIE, reactive ion etching) or combinations of dry and wet etch.

Thereafter, the remaining photoresist material (not shown) and the second oxide layer 420, which protected the nitride layer 418 during the etching process, may be removed. The photoresist material may be removed, for example, by an RCA cleaning process. The RCA cleaning process may include a preliminary cleaning in a solution of sulfuric acid and hydrogen peroxide (10:1). A first cleaning solution (SC1) may use a solution of ammonia hydroxide, hydrogen peroxide and deionized water (0.5:1.5) and a second cleaning solution (SC2) may use a solution of hydrogen chloride, hydrogen peroxide and deionized water (0.6:1.5). Thereafter a vapor hydrofluoric acid (HF) post-etch polymer removal process may be performed using a solution of hydrofluoric acid and water (25:1 or 100:1). Other processes and or solutions may be used.

FIGS. 7a-7e illustrate the formation of a blanket deposition of an insulating layer 710. The insulating layer 710 may be formed of any insulating or dielectric material. As will be discussed below, spacers will be formed from the insulating layer 710 that will isolate the gate electrode from the source and drain regions.

In an embodiment, the insulating layer 710 may be an oxide layer formed by any oxidation process, such as wet or dry thermal oxidation in an ambient comprising an oxide, $H_2O$, NO, or a combination thereof. In a preferred embodiment, the insulating layer 710 is formed using CVD techniques with tetra-ethyl-ortho-silicate (TEOS) and oxygen as a precursor to a thickness of about 50 Å to about 1000 Å, but most preferably about 250 Å in thickness.

In FIGS. 8a-8e, the insulating layer 710 of FIGS. 7a-7e is etched to form a first set of spacers 810. The first set of spacers 810 may be formed by, for example, an anisotropic dry etch process. Because the thickness of the insulating layer 710 is greater along the sidewalls of the trench, portions of the insulating layer 710 along the sidewalls of the trench remain to form spacers 810.

Figure 8A:
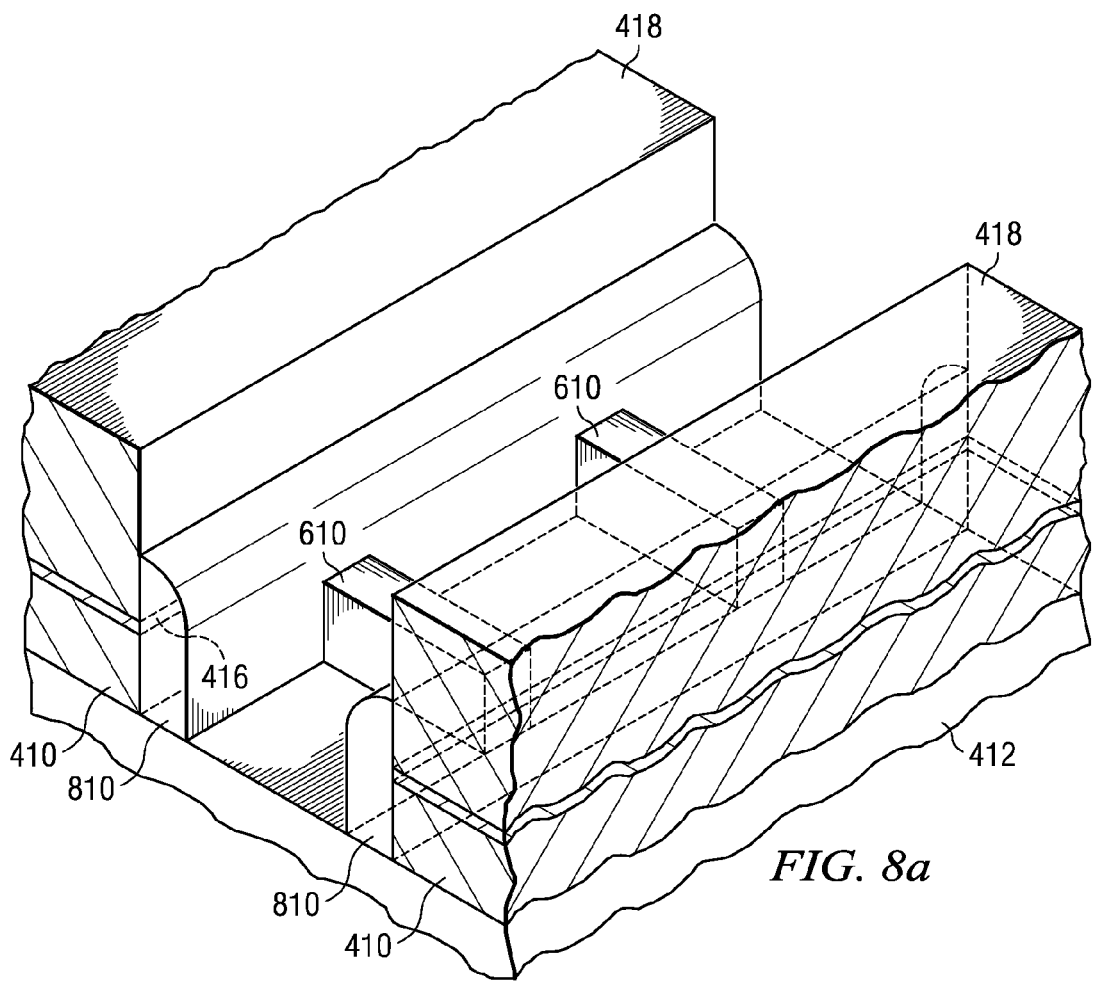
Figure 8B:
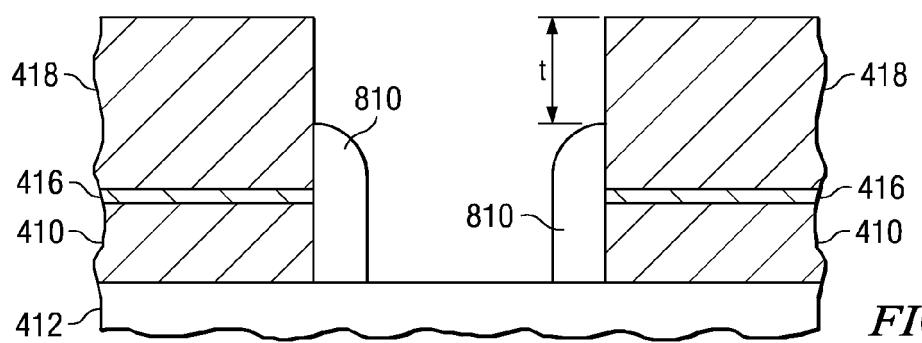
Figure 8C:
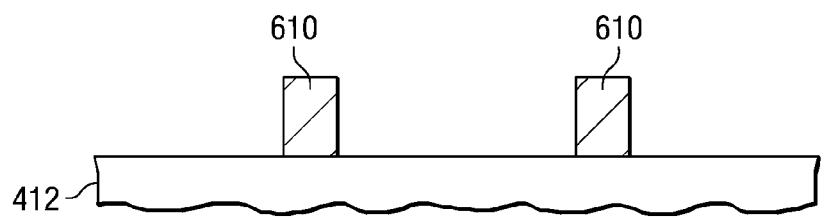
Figure 8D:
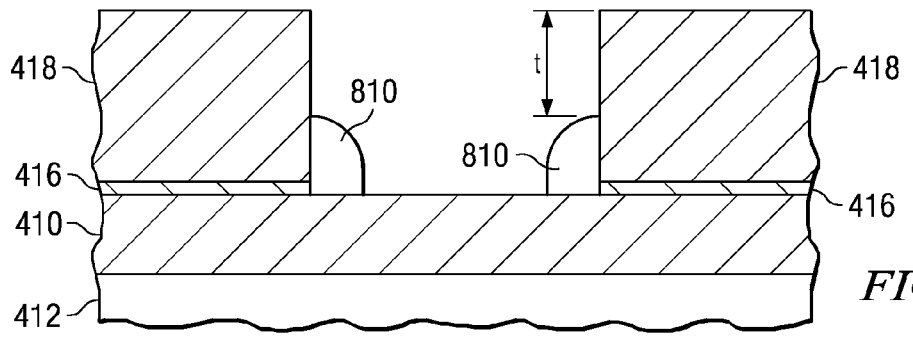
Figure 8E:
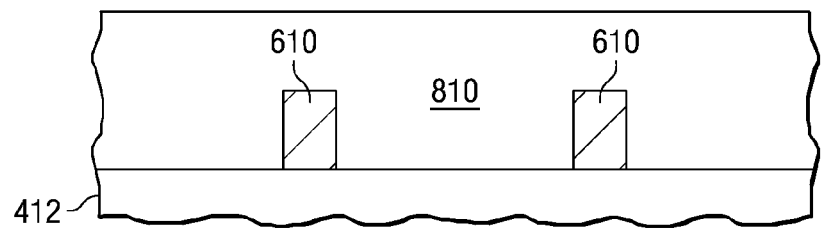
Figure 9A:
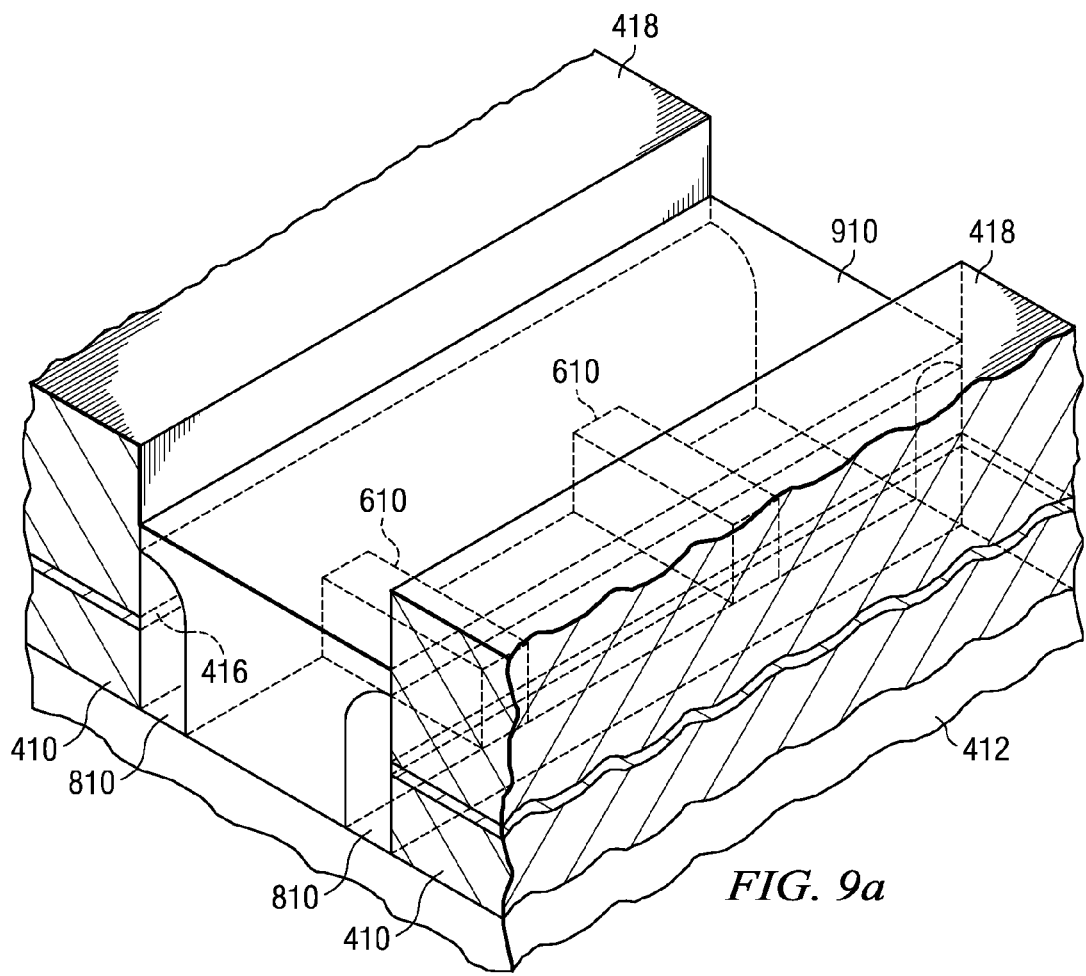
Figure 9B:
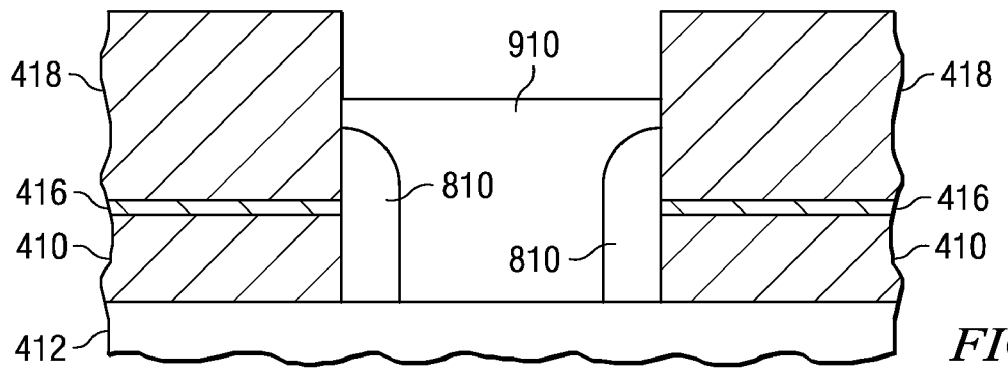
Figure 9C:
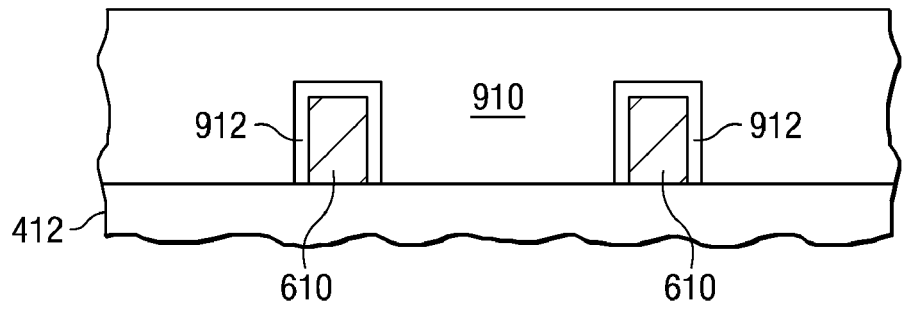
Figure 9D:
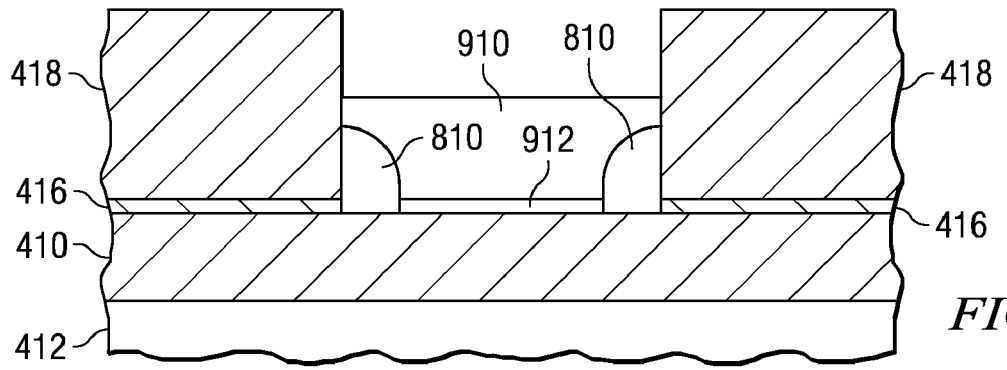
Figure 9E:
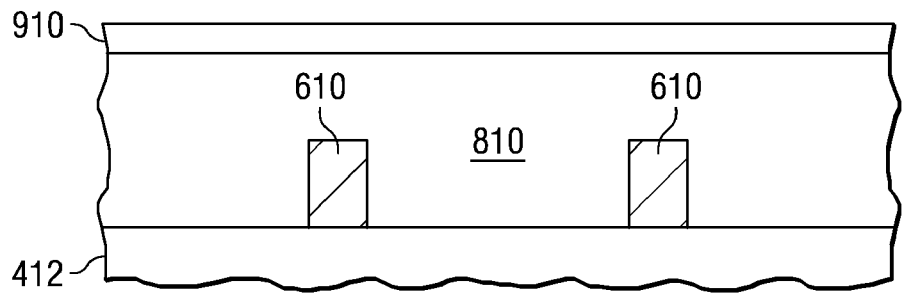
Figure 10A:
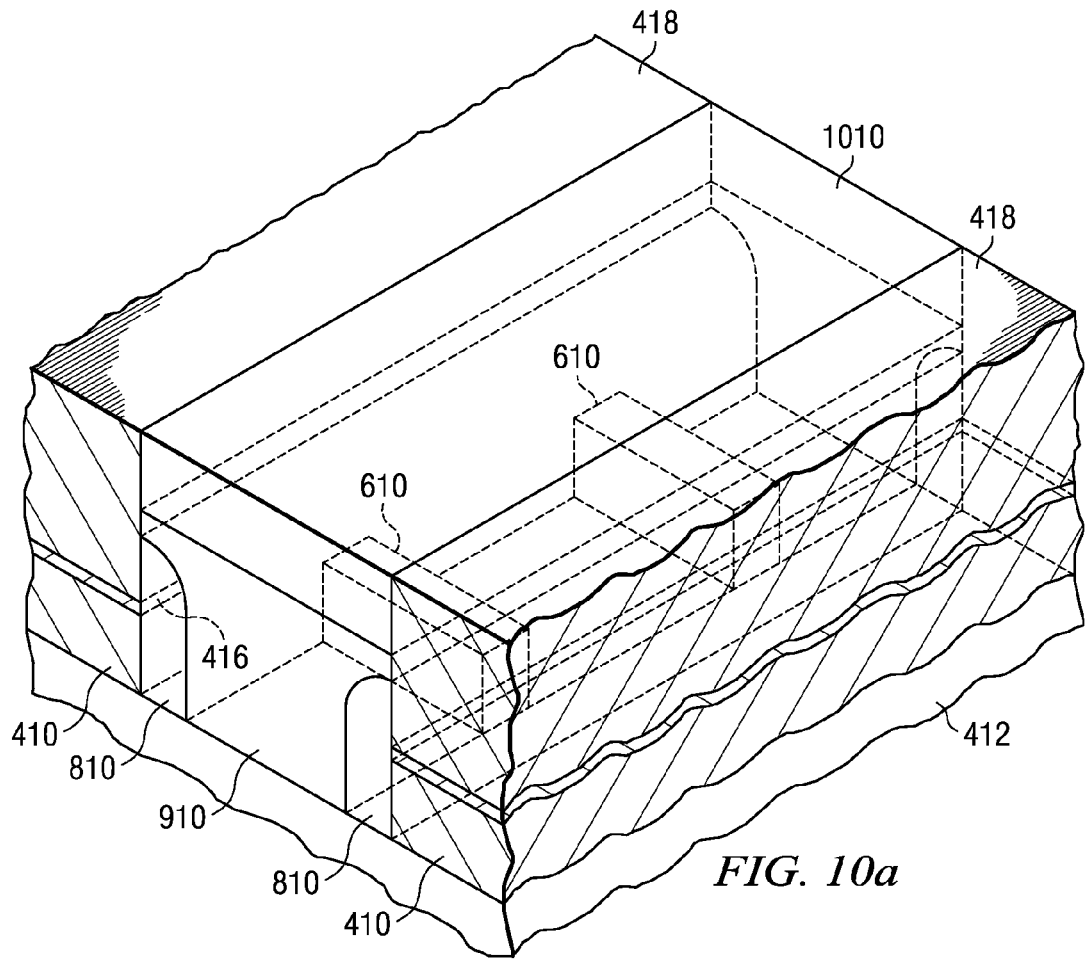
Figure 10B:
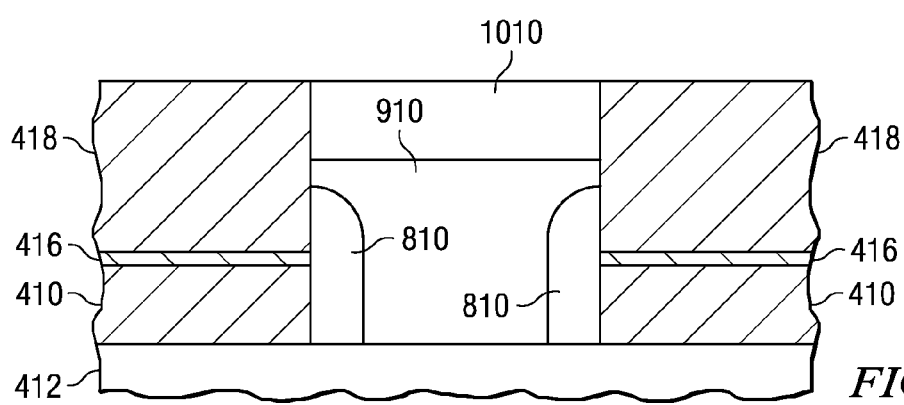
Figure 10C:
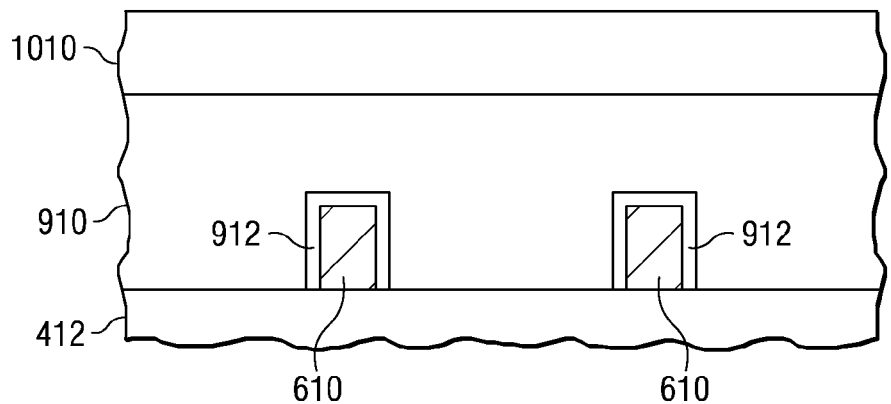
Figure 10D:
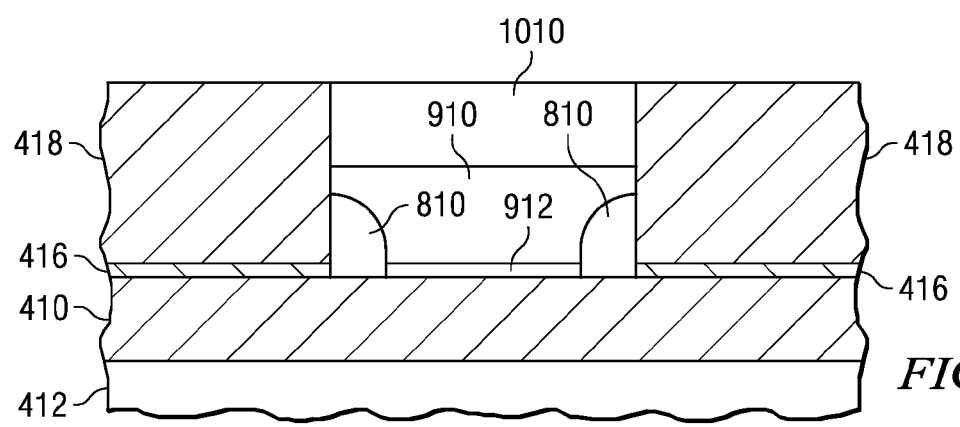
Figure 10E:
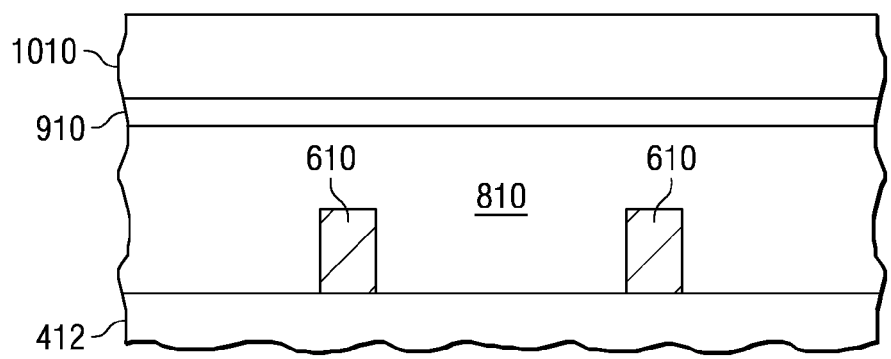
Figure 11A:
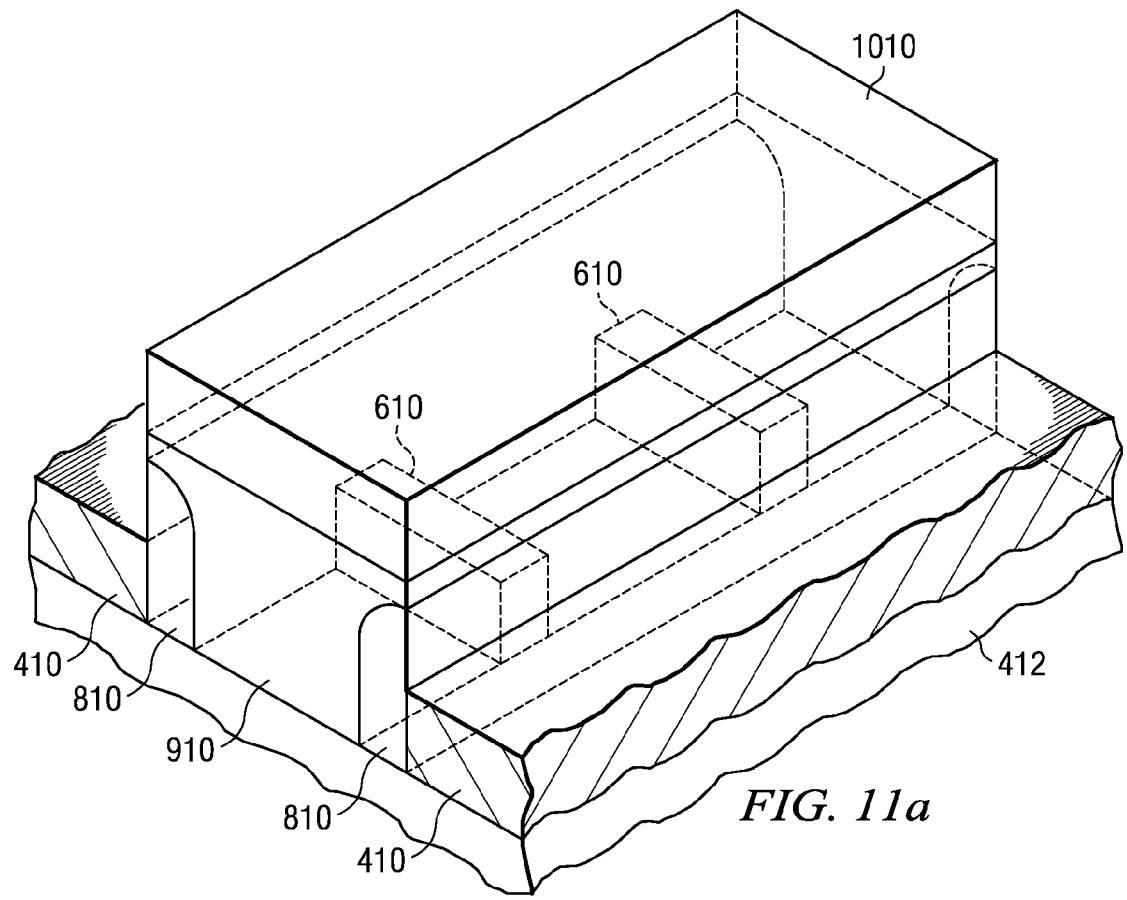
Figure 11B:
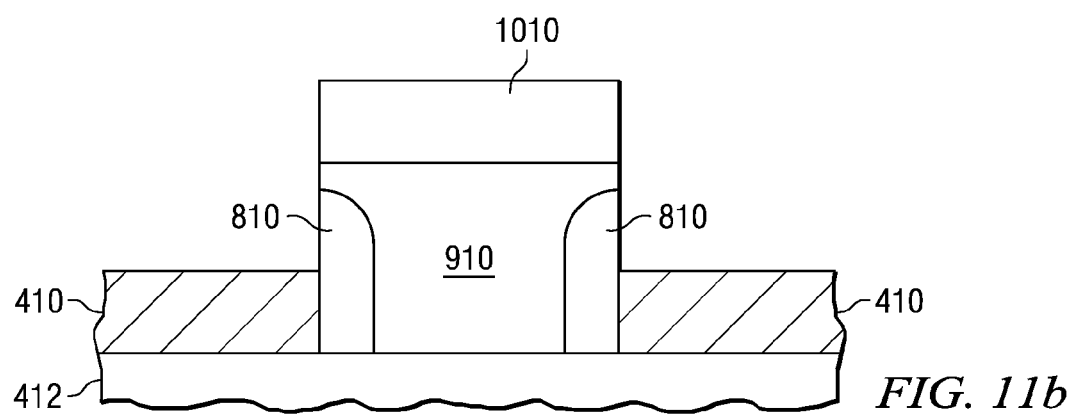
Figure 11C:
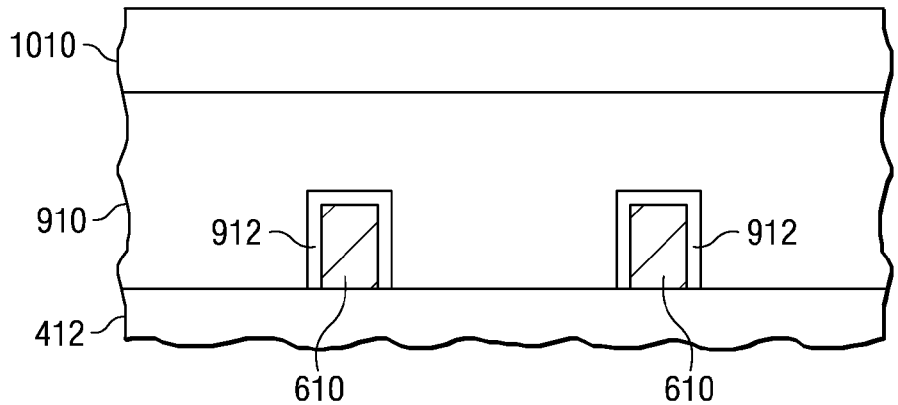
Figure 11D:
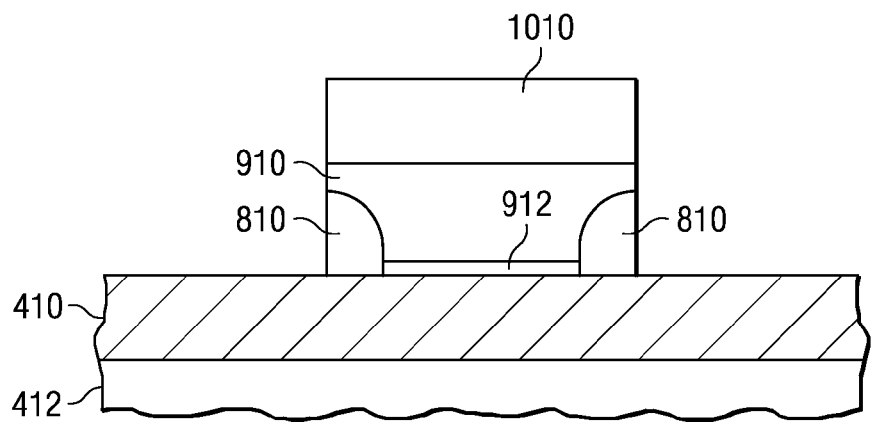
Figure 11E:
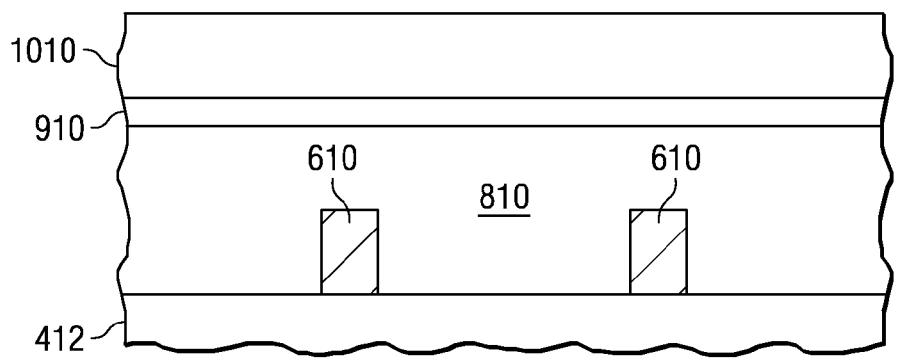
Figure 12A:
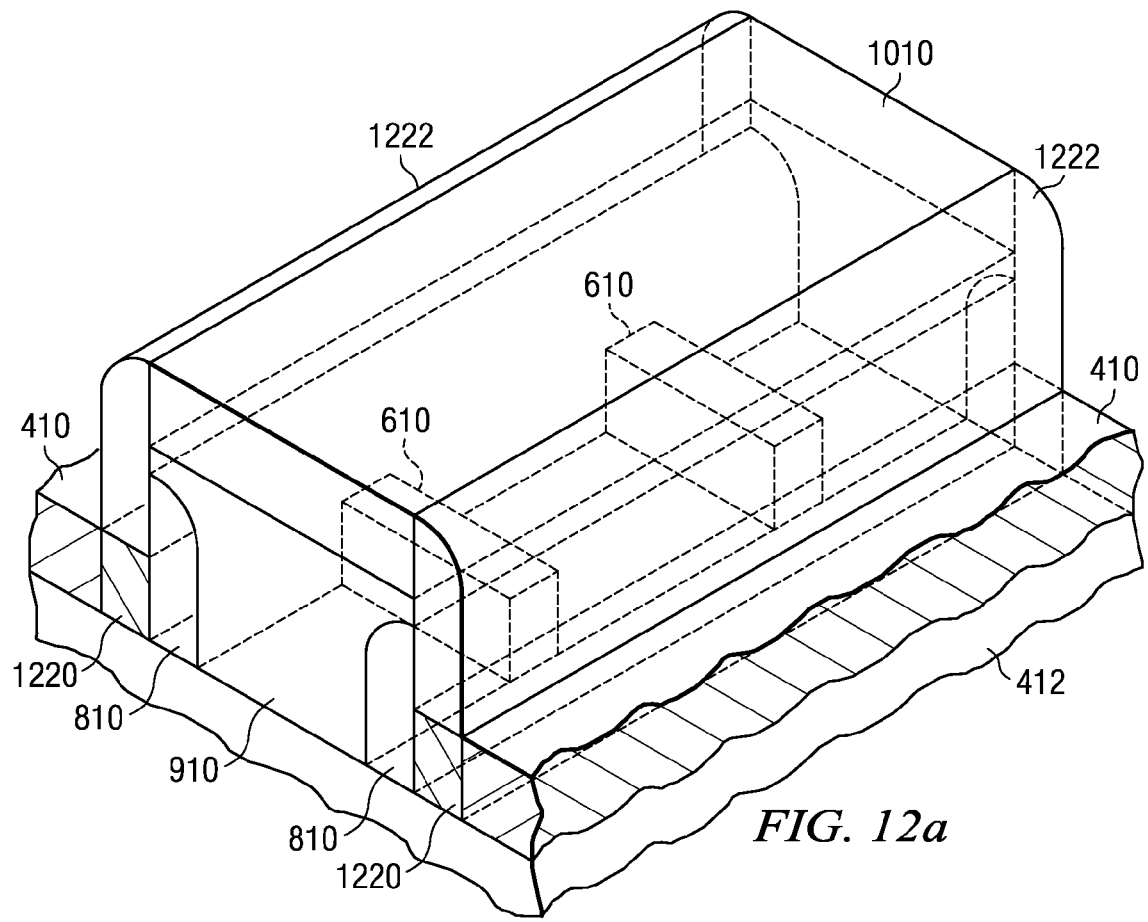
Figure 12B:
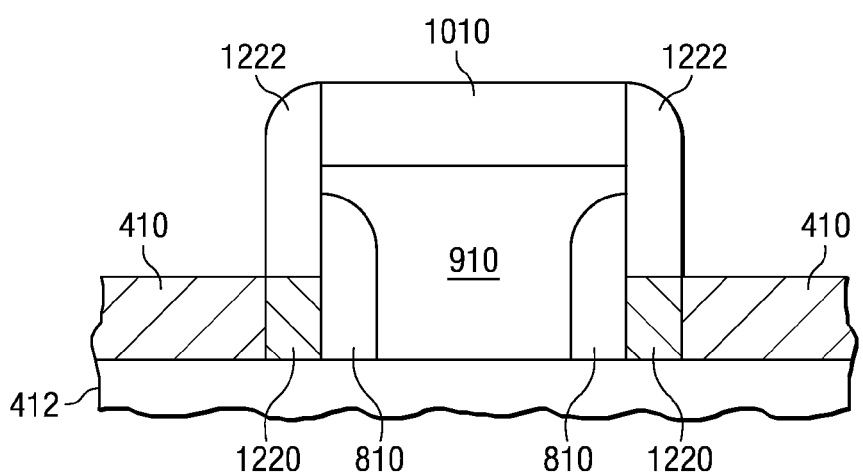
Figure 12C:
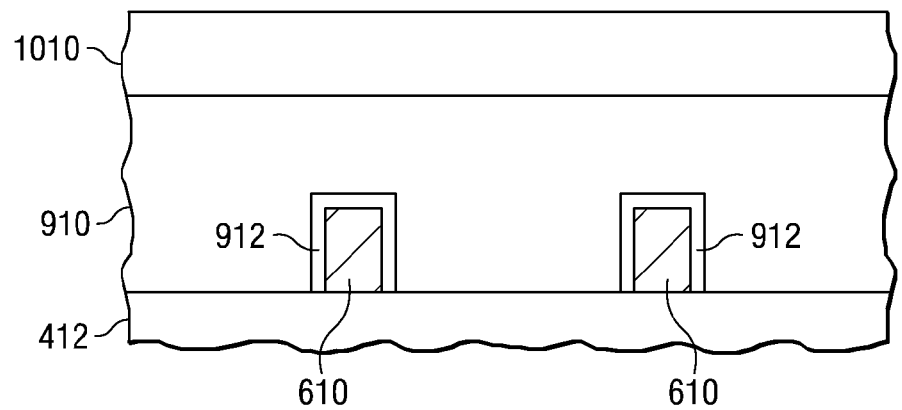
Figure 12D:
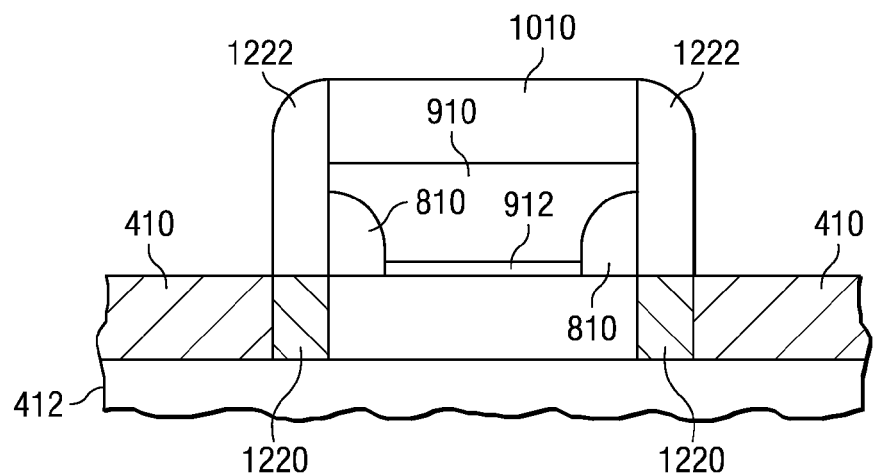
Figure 12E:
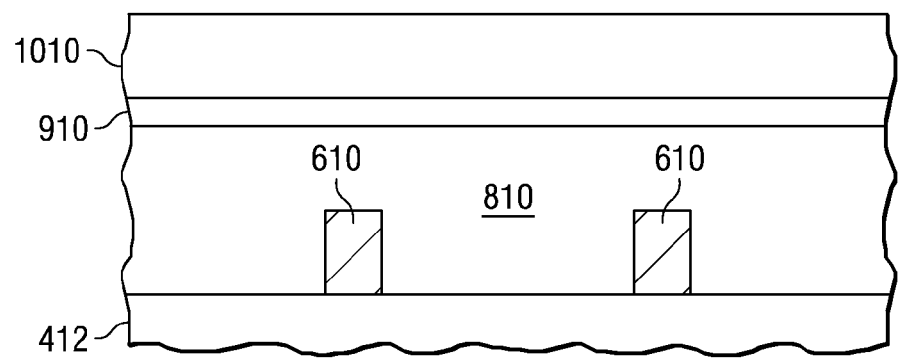
Figure 13A:
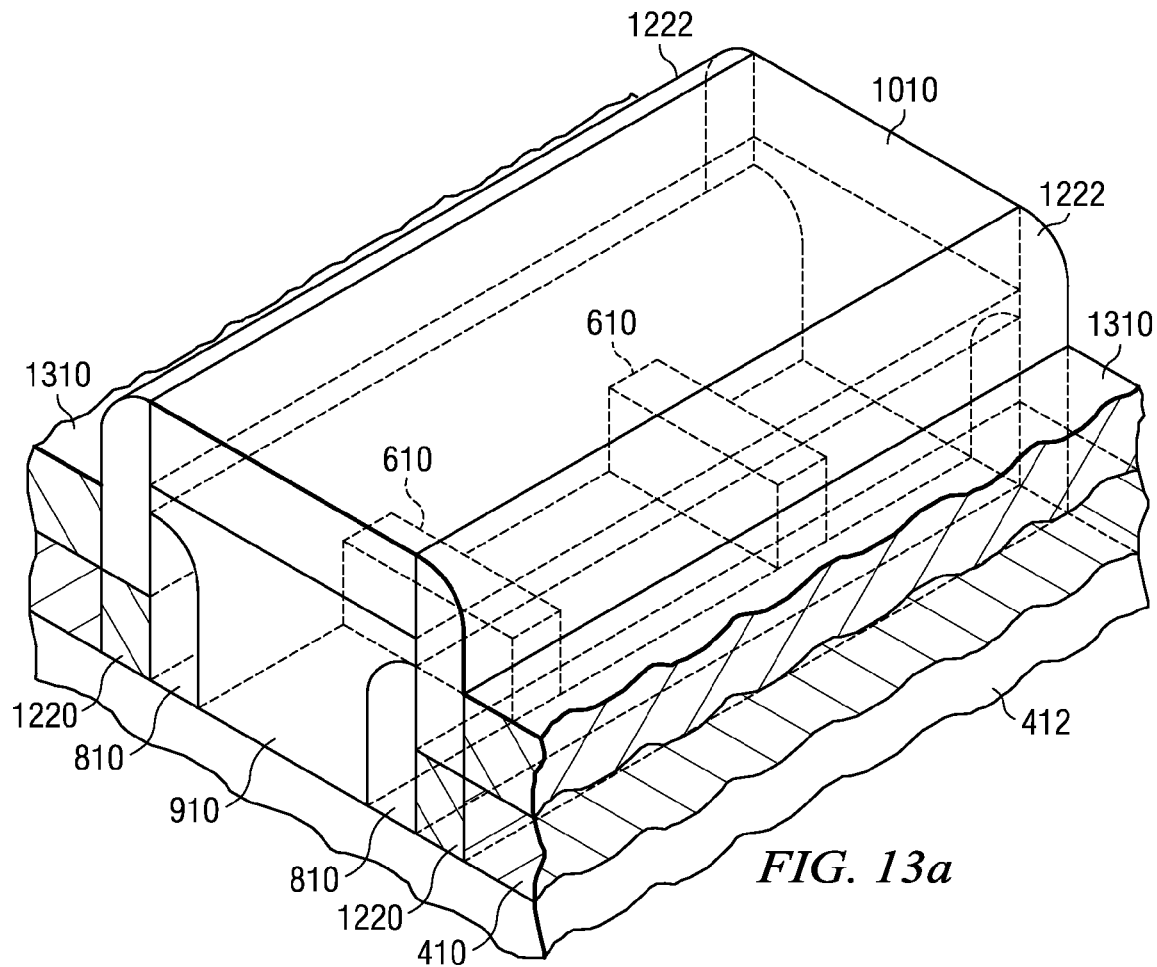
Figure 13B:
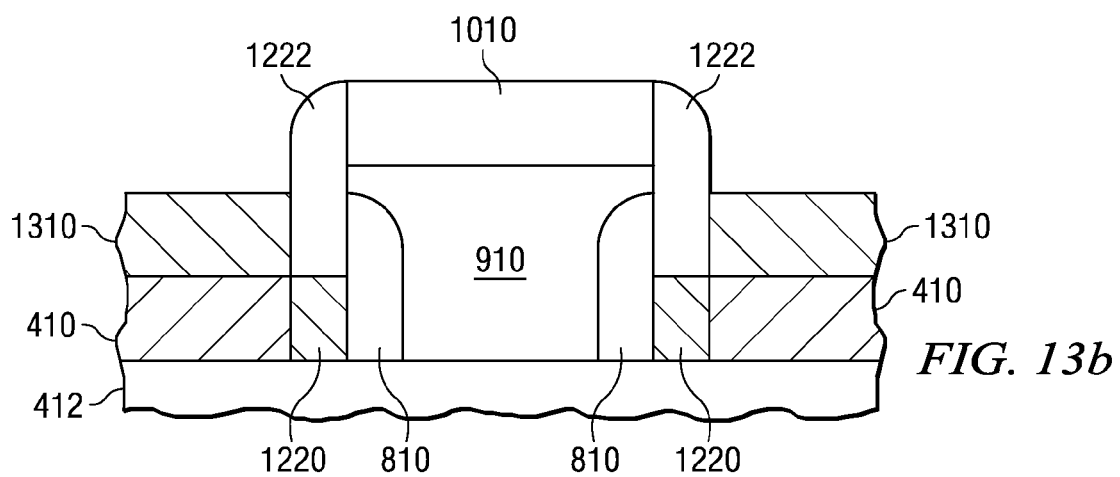
Figure 13C:
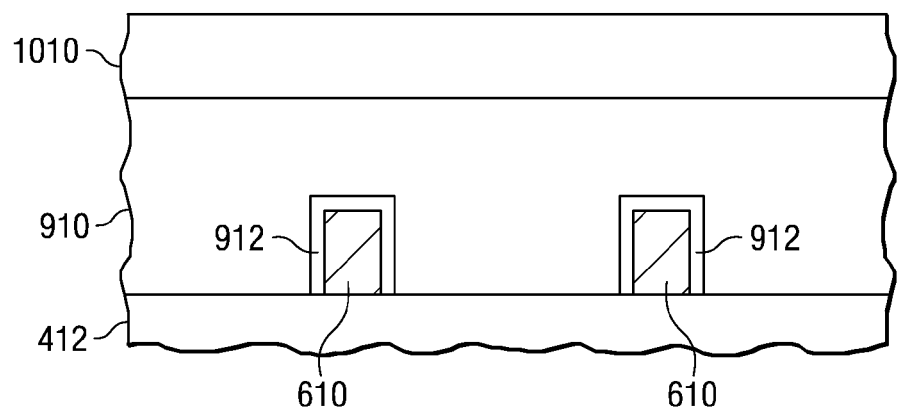
Figure 13D:
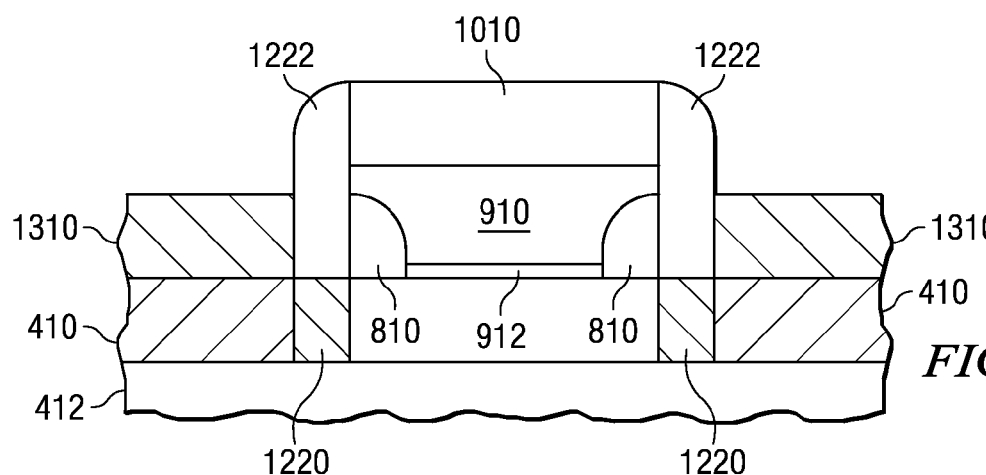
Figure 13E:
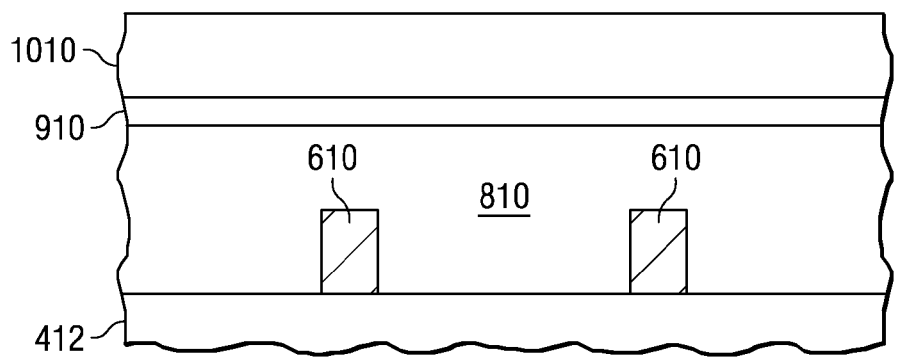
Figure 14A:
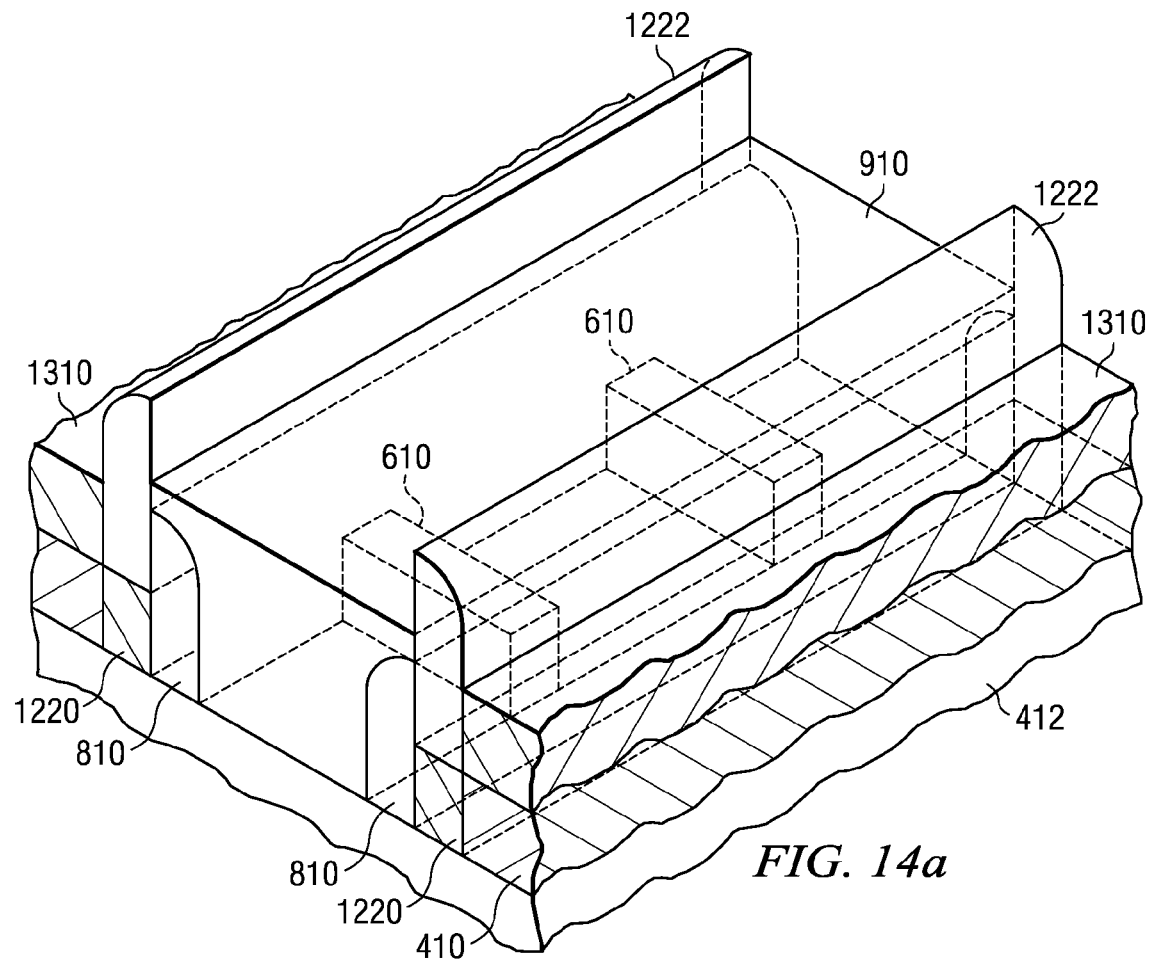
Figure 14B:
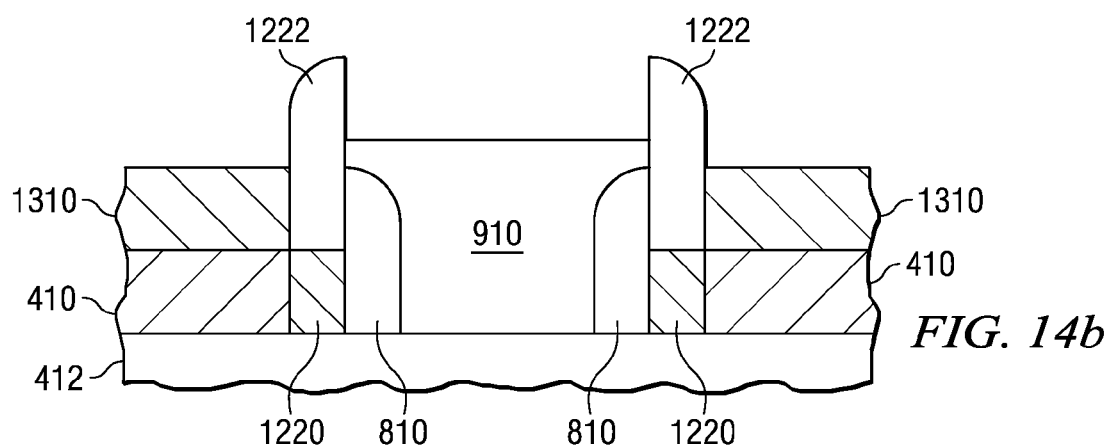
Figure 14C:
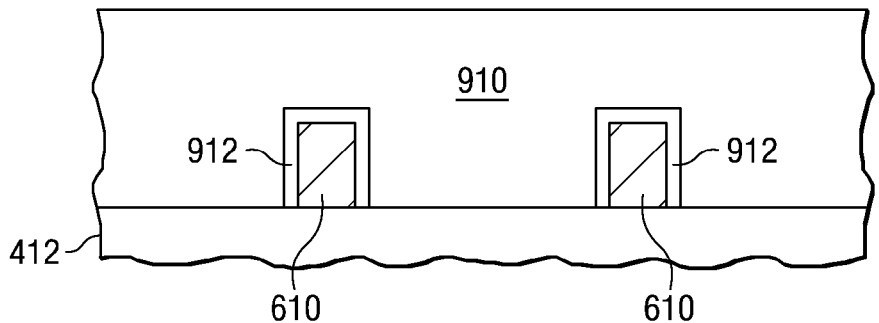
Figure 14D:
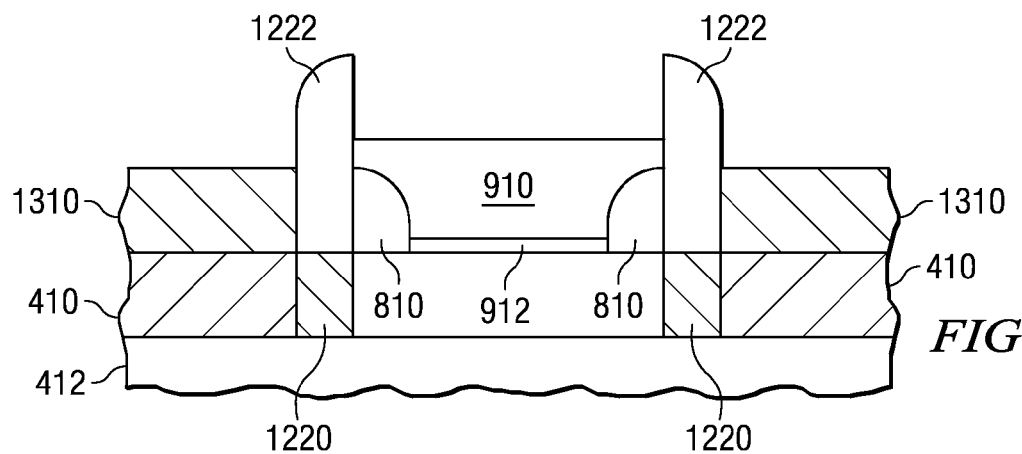
Figure 14E:
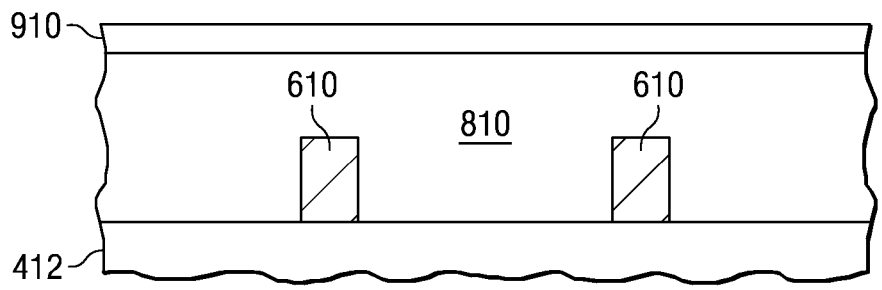

As illustrated in FIGS. 8a, 8b, and 8c, the spacers are etched back a distance t from a top surface of the nitride layer 418. It is preferred that the distance t be at least as great as the height of the fins 610. In this manner, all of the material of the insulating layer 710 (FIGS. 7a-7e) along the sidewalls of the fins 610 will be substantially removed.

FIGS. 9a-9e illustrate the formation of a gate electrode 910. In a preferred embodiment, the gate electrode 910 has a substantially planar surface that covers the fins 610, and the surface of the gate electrode 910 may be above (illustrated) or below the surface of the spacers 810.

The gate electrode 910 may be formed of a semiconductor material such as polysilicon, amorphous silicon, or the like. In other embodiments, gate electrode 910 may comprise a mid-gap metal gate electrode for NMOS and PMOS devices, one or more near-midgap metal gate electrodes, a double layer Poly/a-Si with a metal gate electrode, or the like.

In an embodiment, amorphous silicon is deposited by low-pressure chemical vapor deposition (LPCVD) to a thickness sufficient to fill the trench, e.g., about 20 nm. A planarizing process, such as a chemical-mechanical polishing (CMP) process or the like, is performed to planarize the gate electrode 910 to the surface of the nitride layer 418, wherein the nitride layer 418 acts as an end-point signal during the CMP process. Thereafter, an etch-back process, such as plasma processing, may be performed to recess the gate electrode 910 to the desired thickness within the trench.

Optionally, a gate dielectric layer 912 (FIG. 9d) may be formed prior to forming the gate electrode layer 910. In an embodiment, the gate dielectric layer 912 is preferably an oxide layer formed by any oxidation process, such as the oxidation processes described above with reference to the spacers 810. In the preferred embodiment, the gate dielectric layer 912 is about 10 Å to about 200 Å in thickness, but most preferably about 20 Å in thickness. It should be noted, however, that the thickness of the gate dielectric layer 912 may vary dependent upon the type of material (e.g., oxide vs. high-k dielectric) and application (e.g., High performance logic versus Low Standby Power.

In FIGS. 10a-10e, a filler layer 1010 is formed over the gate electrode 910. The filler layer 1010 is preferably a sacrificial oxide layer formed by a blanket oxide deposition process, such as CVD, LPCVD, PVD, or the like, followed by a planarization step. The planarization step may be, for example, a CMP process that removes the excess oxide from the surface of the nitride layer 418.

FIGS. 11a-11e illustrate the wafer after the remaining first oxide layer 416 and the nitride layer 418 have been removed. The nitride layer 418 may be removed, for example, by performing an isotropic etch process using a solution of phosphoric acid ($H_3PO_4$). The first oxide layer 416 may be removed, for example, by wet etch or by performing an anisotropic plasma etch process using an ambient environment of $CF_4$, $C_2F_6$, $O_2$, $CHF_3$, $C_4F_8$, Ar, He or the like.

FIGS. 12a-12e illustrate the wafer after formation of lightly-doped drains (LDD) 1220 and implant spacers 1222. In an embodiment, the LDD 1220 may be doped with, for example, an N-type dopant, such as arsenic ions, at a dose of about 5E18 to about 5E19 atoms/cm$^3$ and at an energy of about 4 to about 30 KeV. Alternatively, the LDD 1220 may be doped with other n-type dopants such as nitrogen, phosphorous, antimony, or the like. P-type dopants, such boron, aluminum, indium, and the like, may be used to fabricate PMOS devices.

The implant spacers 1222 preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y{:}H_z$, or a combination thereof. The implant spacers 1222 may be formed from a layer comprising $Si_3N_4$ that has been deposited using CVD techniques with silane and ammonia as precursor gases, and deposition temperatures ranging from 600° to 900° C. to a thickness of about 50 Å to about 1000 Å, but more preferably about 250 Å. Thereafter, the implant spacers 1222 may be patterned by performing an isotropic etch process using a solution of phosphoric acid ($H_3PO_4$).

In FIGS. 13a-13e, an optional selective epitaxial growth (SEG) is performed to create raised source/drain regions 1310. The raised source/drain regions 1310 may be formed, for example, of silicon, silicon-carbon, silicon germanium, or the like. Raised source/drain regions formed of silicon have been formed to reduce resistance, and raised source/drain regions of silicon carbon and silicon germanium have been formed to induce strain. One of ordinary skill in the art will appreciate that the raised source/drain regions 1310 are formed utilizing a self-aligned process via the spacers 1222.

A second ion implant procedure may be performed to create highly-doped drains (HDDs), as indicated by the cross-hatched regions. The HDDs may be formed by implanting additional N-type dopants (or P-type dopants for PMOS devices) at an increased dose of about 1E20 to about 1E21 atoms/cm$^3$ and at an energy of about 20 to about 80 KeV.

After the ion implant processes are completed, any implant damage can be annealed through subsequent exposure to elevated temperatures. In an embodiment, the annealing process is performed at a temperature from about 1000° C. to about 1100° C. for about 2 seconds to about 10 minutes. Other annealing processes, such as a laser anneal, flash anneal, spike anneal, or the like, may be used.

The filler layer 1010 may be removed, thereby exposing the gate electrode 910, as illustrated in FIGS. 14a-14e. The filler layer 1010 may be removed by, for example, performing an anisotropic plasma etch process using an ambient environment of $CF_4$, $C_2F_6$, $O_2$, or the like.

Optionally, a salicide (self-aligned silicide) process may be performed to silicide the source/drain regions and the gate electrode to reduce the contact resistance thereof. Generally, the salicide process may be performed by depositing a conductive material over the wafer and performing an anneal to cause the conductive material to react with the underlying silicon. The conductive material may be a metallic silicide such as titanium silicide, cobalt silicide, or nickel silicide. Other materials and silicide processes may be used.

Additional backend processing may be performed thereafter. Backend processing may include, for example, depositing interlayer dielectrics, forming conductive lines, passivation, dicing, packaging, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a source region, a drain region, and a fin that connects the source region to the drain region;
    a gate electrode having a substantially planar surface overlying the fin and positioned between the drain region and the source region;
    a first set of spacers positioned between a first sidewall of the gate electrode and the source region and between a second sidewall of the gate electrode and the drain region, the first set of spacers comprising a first surface, a second surface opposite the first surface, and a top surface connecting the first surface and the second surface, wherein the top surface is covered by the gate electrode; and
    a second set of spacers positioned on at least a portion of a top surface of the source region and the drain region and alongside at least a portion of the first set of spacers, wherein at least a portion of sidewalls of the second set of spacers contacts a portion of the first or second sidewall of the gate electrode.

2. The semiconductor device of claim 1, further comprising a raised source region over the source region and a raised drain region over the drain region.

3. The semiconductor device of claim 1, wherein the first set of spacers comprise oxide spacers.

4. The semiconductor device of claim 3, wherein the second set of spacers comprise silicon nitride spacers.

5. The semiconductor device of claim 1, wherein the second set of spacers comprise silicon nitride spacers.

6. The semiconductor device of claim 1, further comprising a gate oxide layer between the gate electrode and the fin.

7. The semiconductor device of claim 1, further comprising a high-k dielectric layer between the gate electrode and the fin.

8. The semiconductor device of claim 1, further comprising silicide regions over a surface of the gate electrode, the source region, and the drain region.

9. The semiconductor device of claim 1, further comprising a second fin connecting the source region and the drain region.

10. The semiconductor device of claim 1, wherein the source region, the drain region and the fin overlie a substrate.

11. The semiconductor device of claim 10, wherein the substrate comprises an SOI substrate.

12. A semiconductor device comprising:
    a source region, a drain region, and a plurality of fins that connect the source region to the drain region;
    a gate electrode having a substantially planar surface overlying the fins and positioned between the drain region and the source region;
    a first set of spacers positioned between a first sidewall of the gate electrode and the source region and between a second sidewall of the gate electrode and the drain region, the first set of spacers comprising a first surface, a second surface opposite the first surface, and a top surface connecting the first surface and the second surface, wherein the top surface is covered by the gate electrode; and a second set of spacers positioned on at least a portion of a top surface of the source region and the drain region and alongside at least a portion of the first set of spacers, wherein at least a portion of sidewalls of the second set of spacers contacts a portion of the first or second sidewall of the gate electrode.

13. The semiconductor device of claim 12, further comprising a raised source region over the source region and a raised drain region over the drain region.

14. The semiconductor device of claim 12, wherein the first set of spacers comprise oxide spacers.

15. The semiconductor device of claim 14, wherein the second set of spacers comprise silicon nitride spacers.

16. The semiconductor device of claim 12, further comprising a gate oxide layer between the gate electrode and the fin.

17. The semiconductor device of claim 12, further comprising a high-k dielectric layer between the gate electrode and the fin.

18. The semiconductor device of claim 12, further comprising silicide regions over a surface of the gate electrode, the source region, and the drain region.

19. The semiconductor device of claim 12, wherein the source region, the drain region and the fin overlie a substrate.

20. The semiconductor device of claim 19, wherein the substrate comprises an SOI substrate.

* * * * *